United States Patent [19]

Harafuji et al.

[11] Patent Number: 5,182,718
[45] Date of Patent: Jan. 26, 1993

[54] METHOD AND APPARATUS FOR WRITING A PATTERN ON A SEMICONDUCTOR SAMPLE BASED ON A RESIST PATTERN CORRECTED FOR PROXIMITY EFFECTS RESULTING FROM DIRECT EXPOSURE OF THE SAMPLE BY A CHARGED-PARTICLE BEAM OR LIGHT

[75] Inventors: Kenji Harafuji, Moriguchi; Akio Misaka, Hirakata; Hiromitsu Hamaguchi, Moriguchi; Kenji Kawakita, Neyagawa, all of Japan

[73] Assignee: Matsushita Electric Industrial Co., Ltd., Osaka, Japan

[21] Appl. No.: 500,926

[22] Filed: Mar. 29, 1990

[30] Foreign Application Priority Data

Apr. 4, 1989 [JP] Japan .................. 1-085413

[51] Int. Cl.$^5$ .............. G06F 15/60; H01J 37/304
[52] U.S. Cl. ....................... 364/490; 364/489; 364/488; 250/492.3
[58] Field of Search ........... 364/488, 489, 490, 491; 250/491.1, 492.2, 492.3

[56] References Cited

U.S. PATENT DOCUMENTS 4,812,962  3/1989  Witt ..................... 364/490
5,008,553  4/1991  Abe ..................... 364/490

OTHER PUBLICATIONS

"Data Processing System of Electron-Beam Lithography for VLSI Microfabrication" by Sugiyama et al., IEEE Trans. on Electron Devices, vol. ED-26, No. 4, Apr. 1979, pp. 675-685.
Journal Applied Physics 50 (1979), pp. 4371-4387.

Primary Examiner—Vincent N. Trans
Attorney, Agent, or Firm—Stevens, Davis, Miller & Mosher

[57] ABSTRACT

A method of correcting design patterns in cells, having hierarchial structure and corresponding to exposure patterns, for proximity effects when exposing resist coated on a substrate to a charged-particle beam or to light. A first frame zone is provided having a predetermined width inside the boundary of each cell, and a second frame zone is provided having a predetermined width inside the first frame zone. Proximity effect correction operations are performed such that a pattern in the second frame zone and a pattern inside the second frame zone are used as a pattern to be corrected and a pattern in the first frame zone is used as a reference pattern when correcting pattern data in each cell for proximity effects and a pattern in the first frame zone in each cell is added to the pattern to be corrected and a pattern in the second frame zone in each cell is used as a reference pattern when correcting pattern data in a cell directly overlying each cell for proximity effect.

24 Claims, 28 Drawing Sheets

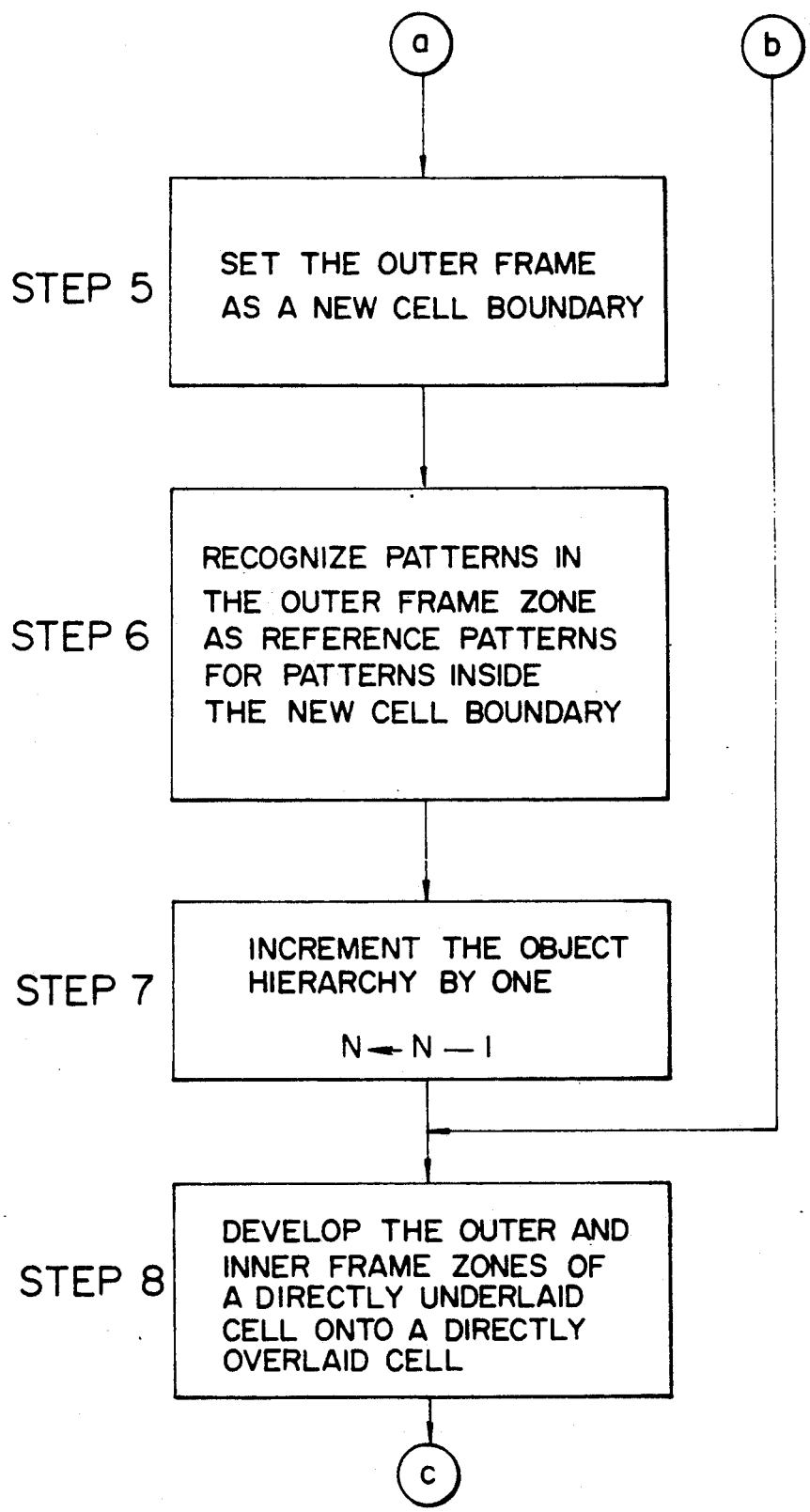
FIG. IB

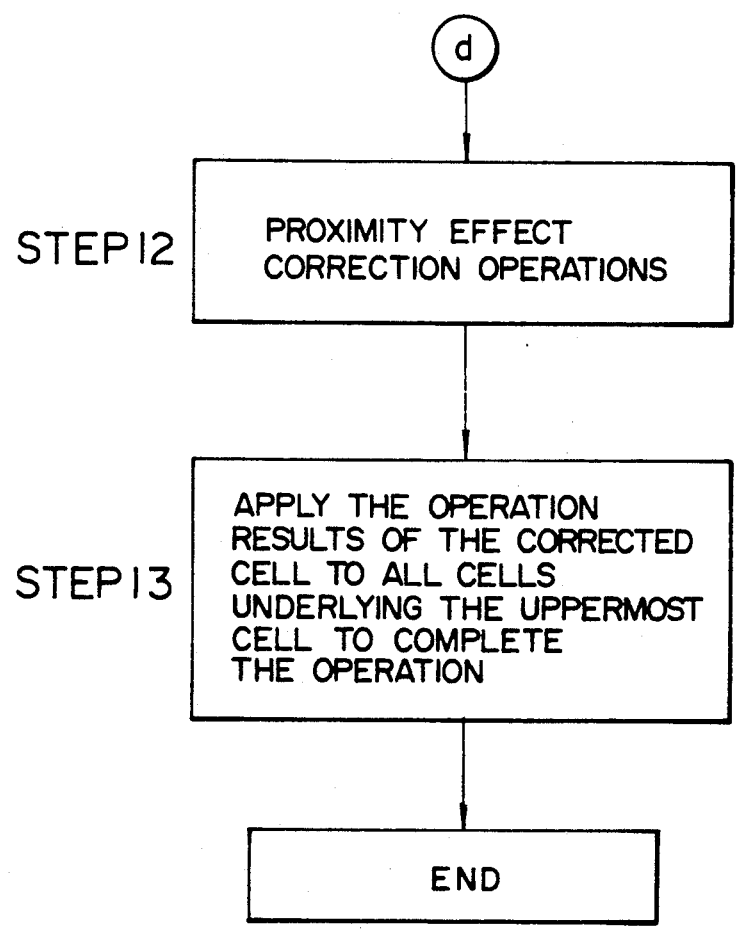
FIG. ID

| HIERARCHY N | CELL NAME |
|---|---|
| 1 | A |
| 2 | B |
| NMAX= 3 | C |

FIG. 5
FIG. 5a
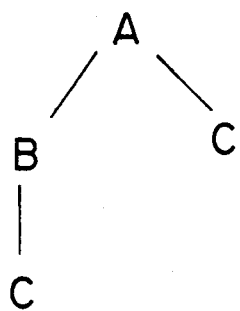
FIG. 5b
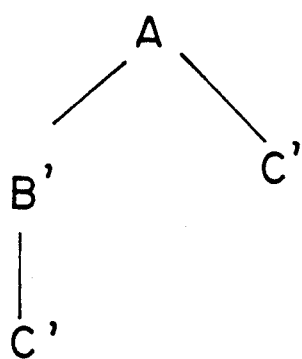

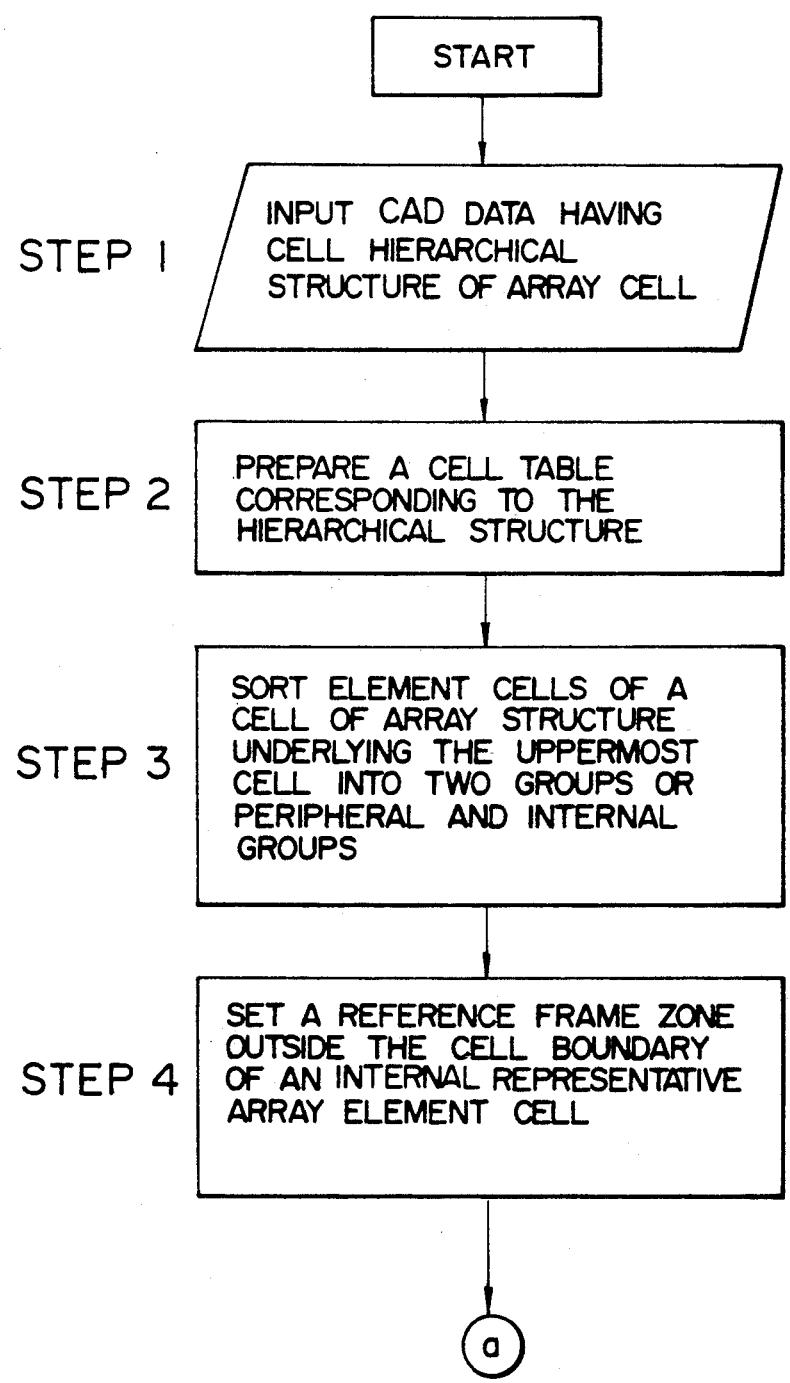

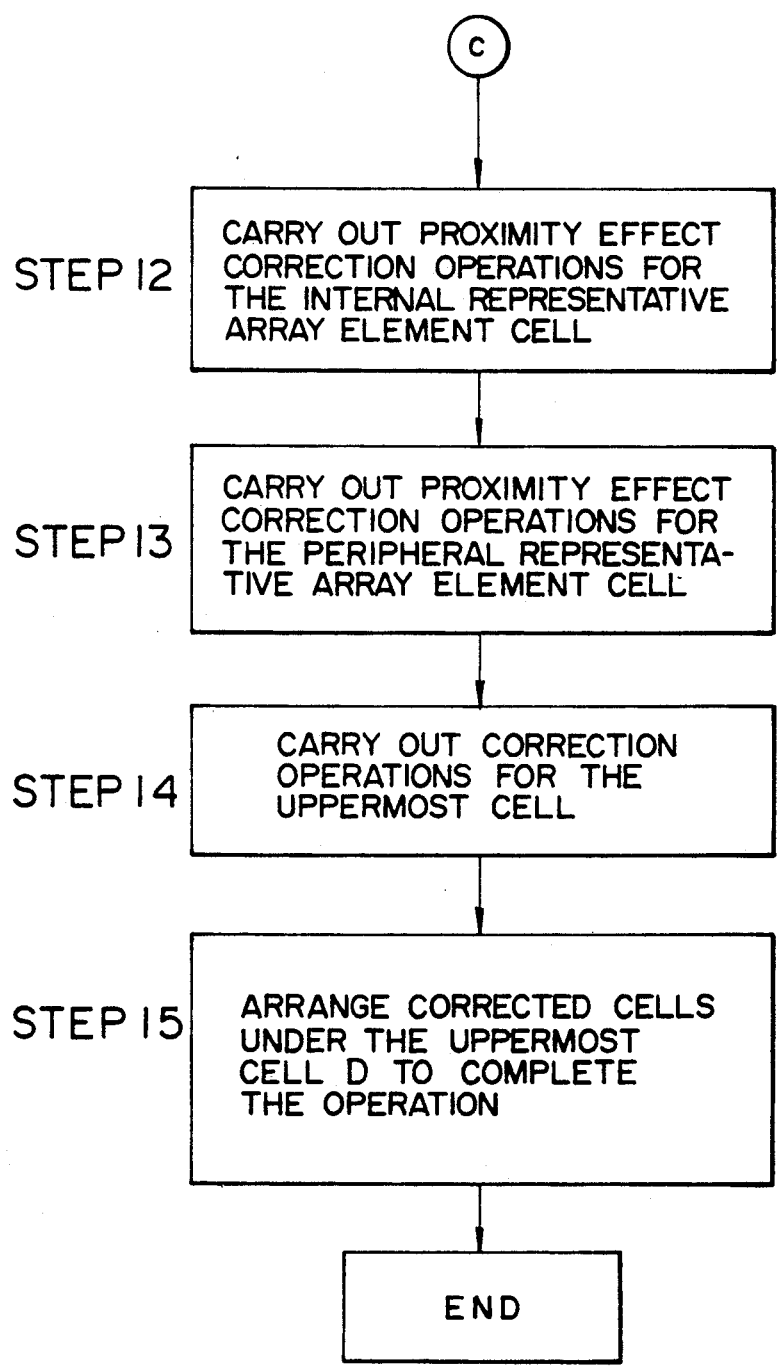

PRIOR ART

METHOD AND APPARATUS FOR WRITING A PATTERN ON A SEMICONDUCTOR SAMPLE BASED ON A RESIST PATTERN CORRECTED FOR PROXIMITY EFFECTS RESULTING FROM DIRECT EXPOSURE OF THE SAMPLE BY A CHARGED-PARTICLE BEAM OR LIGHT

BACKGROUND OF THE INVENTION

The present invention relates to a method of correcting proximity effects occurring in pattern formation based on direct writing by a charged-particle beam or light exposure in the course of a semiconductor manufacturing process.

A technique for fine and high-density formation of patterns in semiconductor integrated circuit devices employs a charged-particle beam exposure apparatus for formation of patterns through direct writing or an optical reduced-projection exposure apparatus for formation of patterns through light exposure. In this formation procedure, dimensional accuracy of patterns is degraded o account of proximity effects, and it is indispensable to correct the patterns for proximity effects in order to improve the dimensional accuracy.

Generally, there are several available methods of correcting proximity effects. In one, a pattern is divided into a plurality of rectangular or triangular element figures and suitable amounts of electron irradiation are assigned to respective figures. In another, original pattern data is treated in advance in expectation of the fact that eventual patterns distorted by proximity effects have desired pattern shapes and dimensions.

FIG. 16 is a flow chart showing a conventional technique of proximity effect correction and FIG. 17 is a diagram useful to explain the FIG. 16 technique. Referring to FIG. 17, reference numeral 1 designates the cell boundary of the uppermost cell A, 2 the cell boundary of a cell B belonging to a second hierarchy, 3 and 4 the cell boundaries of the lowermost cells C, and 5 to 10 patterns in the cells. Conventionally, operations for correction of the aforementioned proximity effects are carried out as follows. Design data of patterns in cells having a hierarchical structure as shown in FIG. 17A are inputted to a computer for performing proximity effect correction operations (STEP 1), and part of the inputted data for the underlaid cells B and C is developed onto the uppermost cell A so that all patterns behave as though they belong to the same hierarchical level (STEP 2). The uppermost cell A subjected to the development is divided by the dividing line, as designated at 11, into a plurality of rectangular sub-zones as shown in FIG. 17B and each sub-zone is surrounded by a reference frame zone 12 (dotted zone in the drawing) having a width h equaling a typical length affected by proximity effects (STEP 3). Operations are carried out for a pattern (or patterns) in each sub-zone and element figures, in that sub-zone, of a pattern (or patterns) which partly belongs to that sub-zone and is cut at the boundary thereof, by looking up proximity effects which are caused by a pattern (or patterns) and element figures in the reference frame zone 12 (STEP 4), and the results of correction are obtained (STEP 5). For example, reference may be made to J. Appl. Phys. 50 (1979), PP 4371 to 4387.

The prior art method, however, faces problems that the disc capacity for ensuring the working file necessary to process large-scale and highly-integrated patterns and the time for processing are drastically increased, and the conventional method can not be used in practical applications.

SUMMARY OF THE INVENTION

In view of the above, the present invention has been achieved and has a its object to provide a proximity effect correction method capable of suppressing an increase in the amount of processing data and decreasing the processing time.

According to the invention, to accomplish the above object, a method of correcting design patterns in cells, having hierarchical structure and corresponding to exposure patterns, for proximity effects when exposing resist coated on a substrate to a charged-particle beam or to light, comprises the steps of providing a first frame zone having a predetermined width inside the boundary of each cell, providing a second frame zone having a predetermined width inside the first frame zone, and performing proximity effect correction operations such that a pattern (or patterns) in the second frame zone and a pattern (or patterns) inside the second frame zone are used as a pattern to be corrected and a pattern (or patterns) in the first frame zone is used as a reference pattern when correcting pattern data in each cell for proximity effects and a pattern (or patterns) in the first frame zone in each cell is added to the pattern to be corrected and a pattern (or patterns) in the second frame zone in each cell is used as a reference pattern when correcting pattern data in a cell directly overlying each cell.

With the construction of the invention as above, the operation processing can be carried out for each hierarchy and in unit of cell and it is sufficient that in respect of a plurality of identical cells underlying the uppermost cell, even if they belong to any hierarchy, proximity effect correction operations are carried out for only one representative cell and the results of the operations are applied, without alternation, to other identical cells, thereby reducing the time for computation. In addition, the maximum amount of data to be processed at a time can be suppressed to the sum of a value obtained by subtracting, from the total pattern data pieces in a single cell, pattern data pieces in all cells underlying the single cell and a value of the number of patterns required for correcting patterns in the single cell which are present in double frames contiguous to the cell boundary inside the cell boundary of a cell directly underlying the single cell, an therefore even design data of large-scale can be processed using a disc of reasonable capacity.

BRIEF DESCRIPTION OF THE DRAWINGS

FIGS. 1A–1D are flow charts showing the operation procedure in a first embodiment according to the invention;

FIGS. 5A and 5B show a hierarchical structure of cells in the present embodiment;

FIGS. 10A-10D are flow charts showing the operation procedure for array cells in a third embodiment according to the invention;

DESCRIPTION OF THE PREFERRED EMBODIMENTS

Figure 1A:
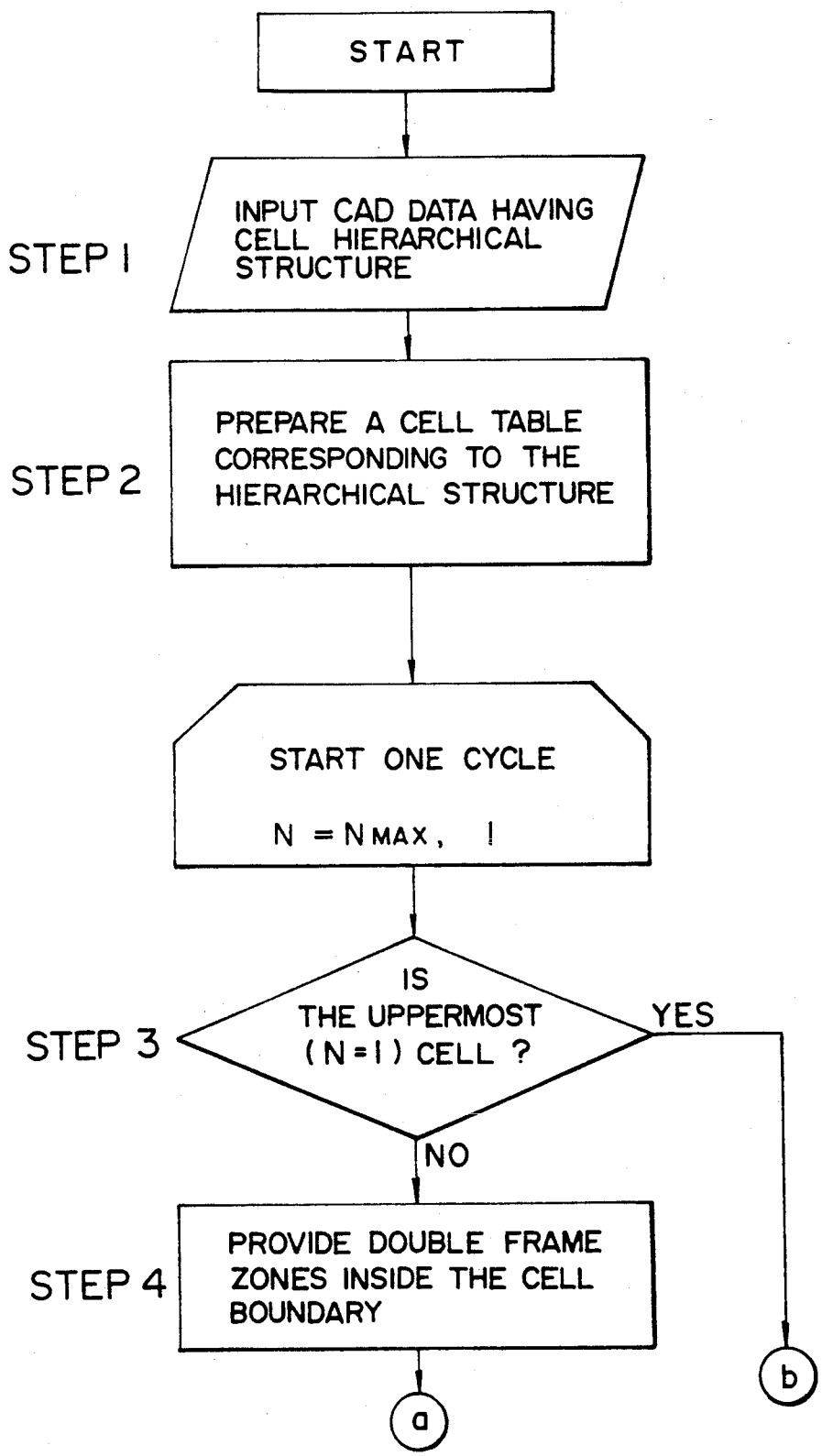
Figure 1C:
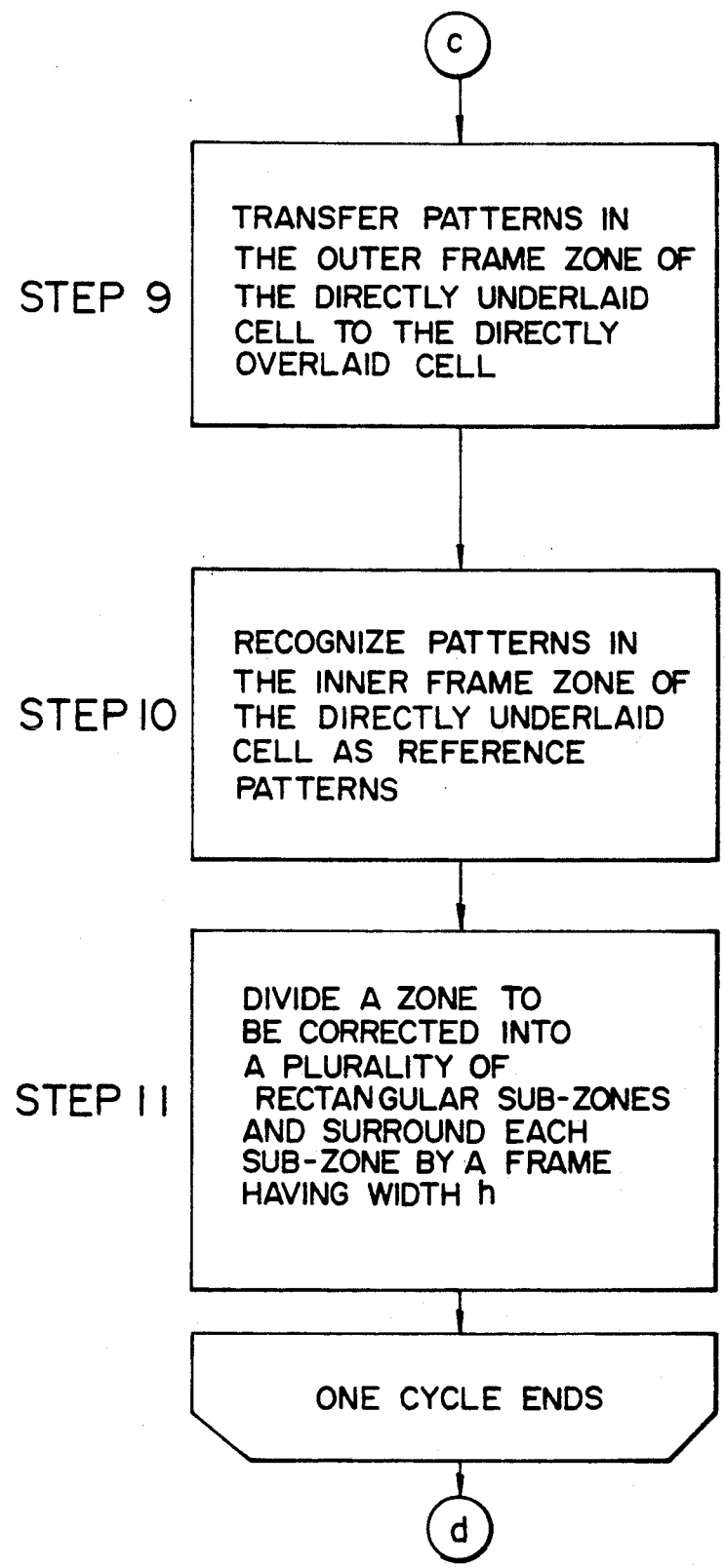
Figures 2, 3:
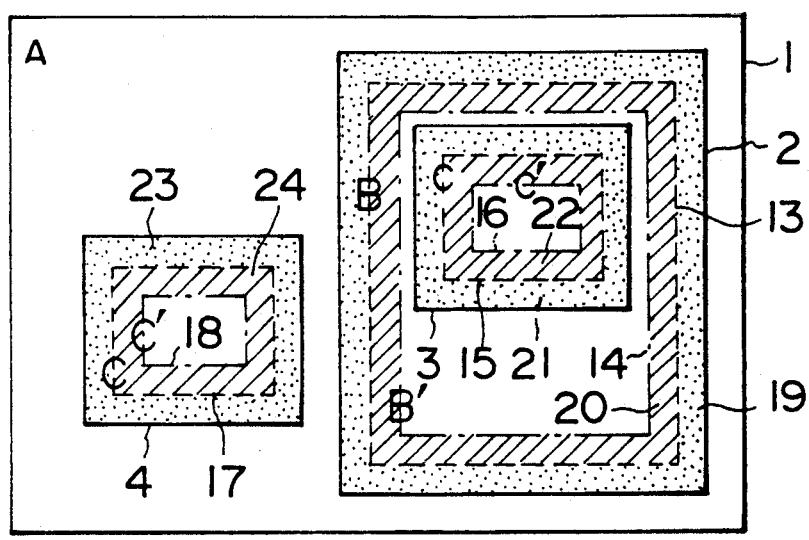
FIG. 2 is a diagram illustrating the arrangement of cells useful to explain the first embodiment.
FIG. 3 is a table for explaining a cell table in the first embodiment.

An embodiment of a method of correcting proximity effects caused in direct writing using an electron beam will now be described. FIGS. 1A-1D are flow charts showing a method for correction of proximity effects according to a first embodiment of the invention, and FIG. 2 is a diagram useful in explaining the present embodiment by using a cell configuration corresponding to that shown in FIG. 17A. But FIG. 2 is devoid of illustration of the patterns 5 to 10 shown in FIG. 17A.

Figure 17A:
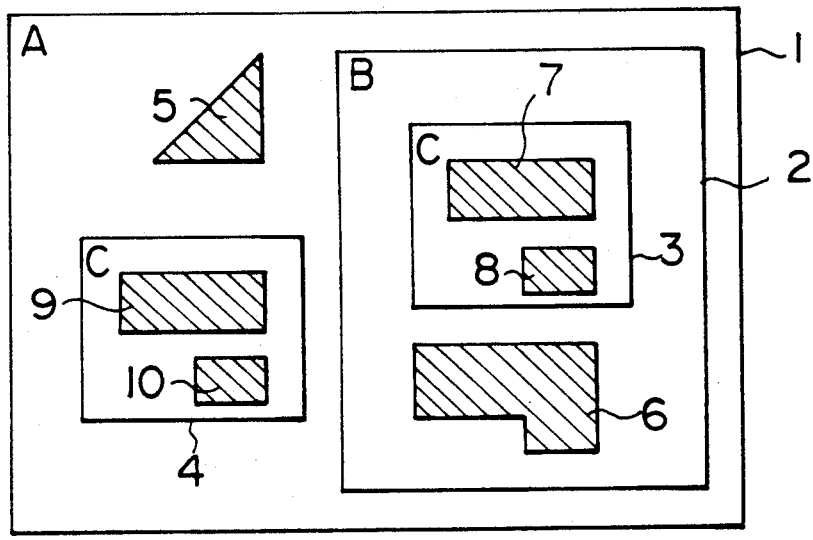
FIGS. 17A and 17B are diagrams illustrating the arrangement of cells useful to explain the prior art sub zone frame method.

Firstly, CAD data of patterns in cells having a hierarchical structure is inputted to a computer for performing proximity effect correcting operations (STEP 1). Subsequently, a cell table corresponding to the cell hierarchical structure shown in FIG. 17A is prepared as illustrated in FIG. 3 (STEP 2). In the cell table illustrated in FIG. 3, the uppermost cell indicated by 1 and a hierarchy 3 corresponding to the lowermost cell in the cell structure in question are arranged in the order of increasing hierarchy in the left column and cell names corresponding to these hierarchies are described in the right column. When a plurality of identical cells belonging to a plurality of hierarchies are involved in preparation of the cell table, the lowermost one of the plurality of hierarchies is registered. For example, the cells C shown in FIG. 17A are present on the two hierarchies, i.e., the second and third hierarchies, and the third hierarchy is registered for the cell C. It is to be noted that in the cell table shown in FIG. 3, a single cell belongs to each hierarchy but a plurality of cells belonging to each hierarchy can also be handled in accordance with the present invention.

In the succeeding STEP 3 to STEP 11, all of the cells registered in the cell table are subjected to a pattern processing corresponding to preparation for proximity effect correction operations in the order of decreasing hierarchy which begins with a cell present on the lowermost hierarchy Nmax and ends with a cell present on the uppermost hierarchy 1.

Firstly, it is decided whether a cell of interest is the uppermost cell, i.e., belongs to an N=1 hierarchy, and if the cell is determined not to be the uppermost cell, the procedure proceeds to the following step (STEP 3).

Given that the hierarchy in question is N, double frames being mutually in nest relationship are provided inside the cell boundary of individual cells belonging to the N hierarchy (STEP 4). For each cell, the width of an outer frame zone (dotted zone in FIG. 2) enclosed by the cell boundary and an outer frame and the width of an inner frame zone (hatched zone in FIG. 2) enclosed by the outer frame and an inner frame are each set to be h, the magnitude of h being set to equal a typical length affected by proximity effects. When conditions of the electron beam accelerating voltage, the kind of resist and the coating thickness thereof are set, the above amount h is determined in accordance with these conditions.

Thereafter, the cell structure is rearranged to set the outer frame as a new cell boundary which substitutes for the original cell boundary (STEP 5). Further, the outer frame zone is treated as a reference pattern zone used when proximity effect correction operations for patterns present in a pattern zone to be corrected are carried out by taking into account the influence of the electron beam irradiated on the outer frame zone, and is subordinated to a new cell (STEP 6). The pattern zone to be corrected referred to herein is an inside zone enclosed by the boundary of the ne cell for the cell of interest. However, when an underlaid cell is present beneath the cell of interest, a zone enclosed by the boundary of a new cell for the directly underlaid cell is subtracted from the aforementioned inside zone to provide a difference zone which is treated as a pattern zone to be corrected. After the processing of STEPS 3 to 6 is completed for all cells present on the N hierarchy and registered in the cell table, the object hierarchical level is incremented by one (STEP 7). For the case of N=1, the processing of STEPS 4 to 7 is omitted.

Thereafter, all cells present on an object hierarchy N−1 and registered in the cell table are handled such that outer and inner frame zones of individual cells on the hierarchy N and directly underlaid individual cells on the hierarchy N−1 are developed onto the cells on the N−1 hierarchy so as to behave as lying on the same hierarchy as the cells on the N−1 hierarchy (step 8). Of the portion developed onto the N−1 hierarchy cell, a pattern (or patterns) in the outer frame zone of the directly underlaid N hierarchy cell is transferred to the N−1 hierarchy cell to behave as the one therein (STEP 9). In addition, a pattern (or patterns) in the inner frame zone of the directly underlaid N hierarchy cell is subordinated to the N−1 hierarchy cell to behave as a reference pattern zone for the pattern zone to be corrected of the N−1 hierarchy cell (STEP 10). Through the above processing of STEPS 4 to 10, the outer frame zone of each cell has a dual character by which it acts, on the one hand, as a reference pattern zone for correction of patterns inside the boundary of a new cell and on the other hand it is transferred to the directly overlaid cell to behave as a pattern therein, and the inner frame zone of each cell has a dual character by which it acts, on the one hand, as a pattern inside the boundary of a new cell and on the other hand behaves as a reference pattern used for correction of a pattern in the directly overlaid cell.

Therefore, through the processing of STEPS 4 to 10, a single pattern file is prepared in connection with the individual new cells as will be explained with reference to FIGS. 4A and B. In an example shown in FIG. 4A where inside a cell G on an N−1 hierarchy, an underlaid cell H is present on an N hierarchy, 69 designates the cell boundary of the cell G, 70 an outer frame of the cell G, 71 the cell boundary of the cell H, 72 an outer frame of the cell H, 73 an inner frame of the cell H, and 74 an outer frame zone of the cell G. The outer frame 70 coincides with the cell boundary of a new cell G' for the cell G and the outer frame 72 coincides with the cell boundary of a new cell H' for the cell H. Reference numeral 75 designates a zone obtained by removing a zone inside the cell boundary of the cell H' from a zone inside the cell boundary of the cell G', 76 an outer frame zone of the cell H, 77 an inner frame zone of the cell H, and 78 a zone inside the inner frame of the cell H.

Figure 4A:
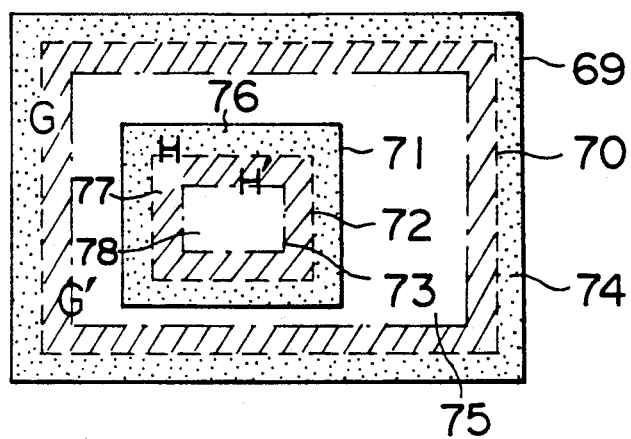
FIGS. 4A and 4B are diagrams for explaining a pattern file.
Figure 4B:
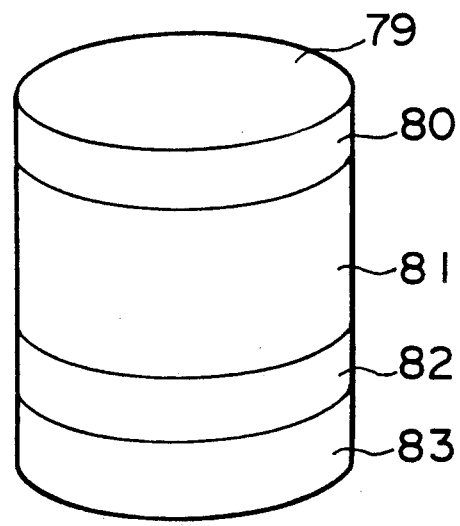

Illustrated in FIG. 4B is a pattern file 79 subordinated to the cell G' in the cell structure shown in FIG. 4A. The pattern file 79 is constructed of four pattern sub-files including a sub-file 80 for patterns in the reference pattern zone of the cell G', a sub-file 81 for real patterns in the zone 75 to be corrected of the cell G', a sub-file 82 for patterns in the outer frame zone 76 of the cell H underunderlying the cell G which are transferred to the cell G' to behave as real patterns to be corrected in the cell G', and a sub-file 83 for patterns in the inner frame zone 77 of the cell H underlying the cell G which behaves as a reference pattern zone of the cell G'.

When a plurality of identical cells underlying the uppermost cell are distributed to a plurality of hierarchies, only one of the identical cells present on the lowermost hierarchy is subjected to the processing of STEPS 4 to 10 and registered in the pattern file 79 to store the contents which can be applied to other identical cells on the same hierarchy and on other hierarchies.

Figure 17B:
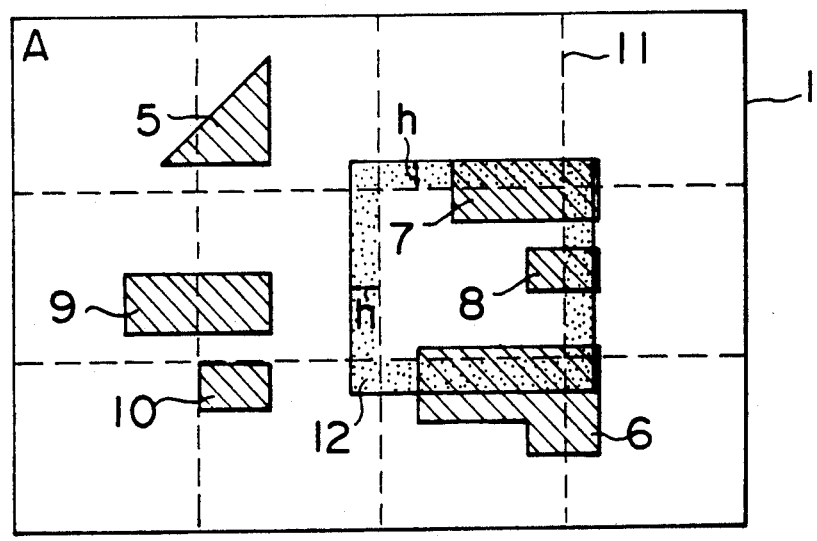

The pattern zone to be corrected of each cell in the sub-file 81 shown in FIG. 4B is divided into rectangular sub-zones as in the division shown in FIG. 17B and the boundary of each sub-zone is surrounded by a reference frame of a width h which defines a reference pattern zone used for correction of patterns in the sub-zone (STEP 11). Here, the width h of the reference frame subordinated to the sub-zone is equal to the width h of the inner and outer frame zones of the cell. This is necessary for the purpose of making the zones, by which effects of proximity patterns are caused, consistent through out a series of operations. However, from the standpoint of the operation processing, the widths may be different. The size of the sub-zone is determined by the operation processing efficiency and calculation accuracy. Provided that the above points are taken into consideration, the size of the sub-zone may be permitted to be different for individual cells. It is sufficient that a series of processings of STEPS 4 to 11 is carried out once for the same cell, and the results can be applied to identical cells belonging to not only the same hierarchy but also different hierarchies.

The processing of STEPS 3 to 11 will be described in greater detail with reference to the drawings. To describe the foregoing processing with reference to FIG. 2, outer and inner frames of a cell B are designated by 13 and 14, respectively, outer and inner frames of a cell C directly underlying the cell B are designated by 15 and 16, respectively, and outer and inner frames of a cell C directly underlying a cell A are designated by 17 and 18. The cell C underlying the cell B is reshaped into a new cell C' having the cell boundary represented by 15, and the patterns in an outer frame zone 21 of the cell C are merged in those of the overlaid cell B. The cell B is reshaped into a new cell B' having the cell boundary represented by 13, and the patterns in an outer frame zone 19 of the cell B are merged in those of the uppermost cell A. The cell C directly underlying the cell A is reshaped into a new cell C' having the cell boundary represented by 17, and patterns in an outer frame zone 23 are transferred into the overlaid cell A to behave as patterns therein. Further, an inner frame zone 20 of the cell B and an inner frame zone 24 of the cell C directly underlying the cell A are subordinated to the cell A to behave as reference pattern zones for the cell A, and an inner frame zone 22 of the cell C underlying the cell B is subordinated to the cell B' to behave as a reference pattern zone therefor.

Illustrated in FIG. 5a is the hierarchical relation between cells shown in FIG. 17A and illustrated in FIG. 5b is a hierarchical structure of cells rearranged in accordance with the present invention. Putting aside the uppermost cell A, the underlaid cells B and C change in their cell boundary and hence there results a change as shown in FIG. 5b.

Figure 6:
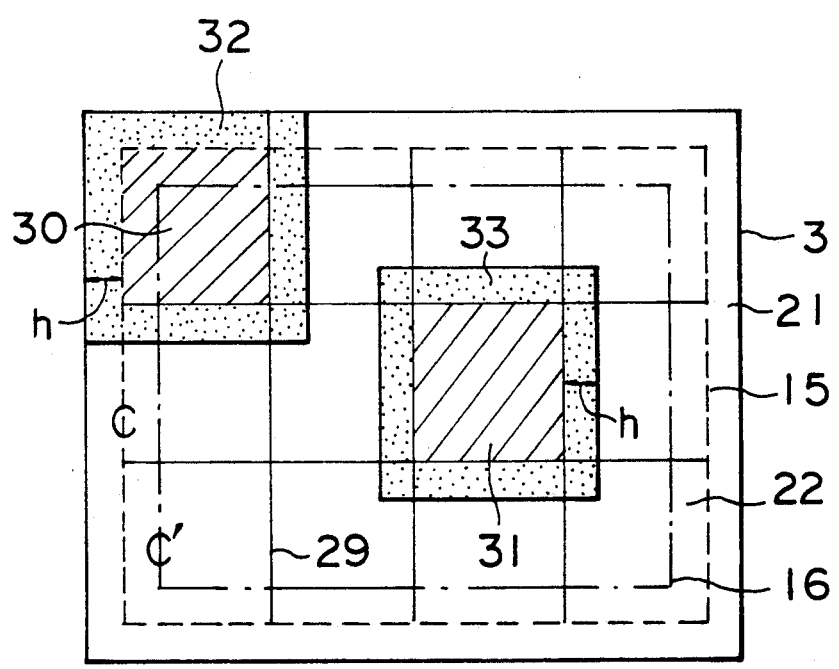
FIGS. 6 and 7 are diagrams useful in explaining the cell arrangement in greater detail.

To further describe the foregoing, the cell C' underlying the cell B' is extracted and illustrated in FIG. 6. Since no cell underlying the cell C' is present, a zone enclosed by the boundary 15 of the cell C' is divided into rectangular sub-zones of suitable size and each sub-zone is surrounded by a frame zone having a width of h. In FIG. 6, representative sub-zones 30 and 31 are hatched and surrounded by reference frame zones 32 and 33, respectively. Practically, all sub-zones are surrounded by reference frame zones. Especially, the reference frame zone 32 of the sub-zone 30 contiguous to the cell boundary 15 overlaps part of the zone 21. Denoted by 29 is the dividing line for formation of the sub-zones.

Figure 7:
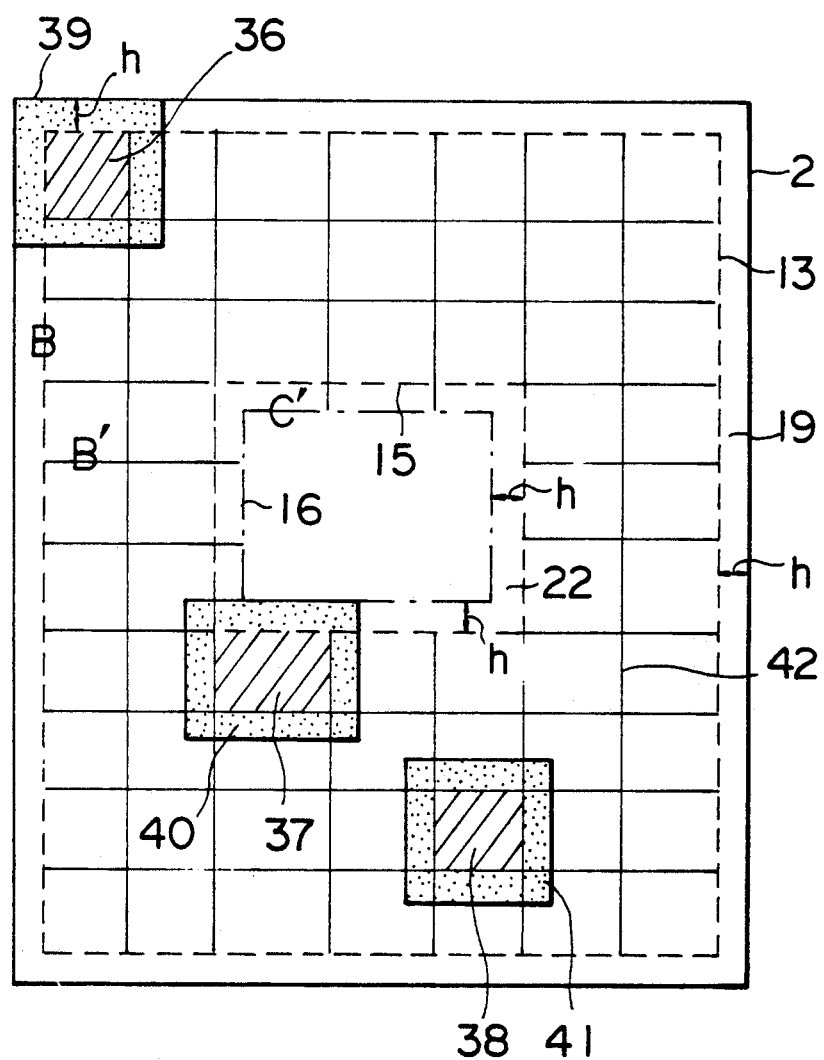
Figure 8A:
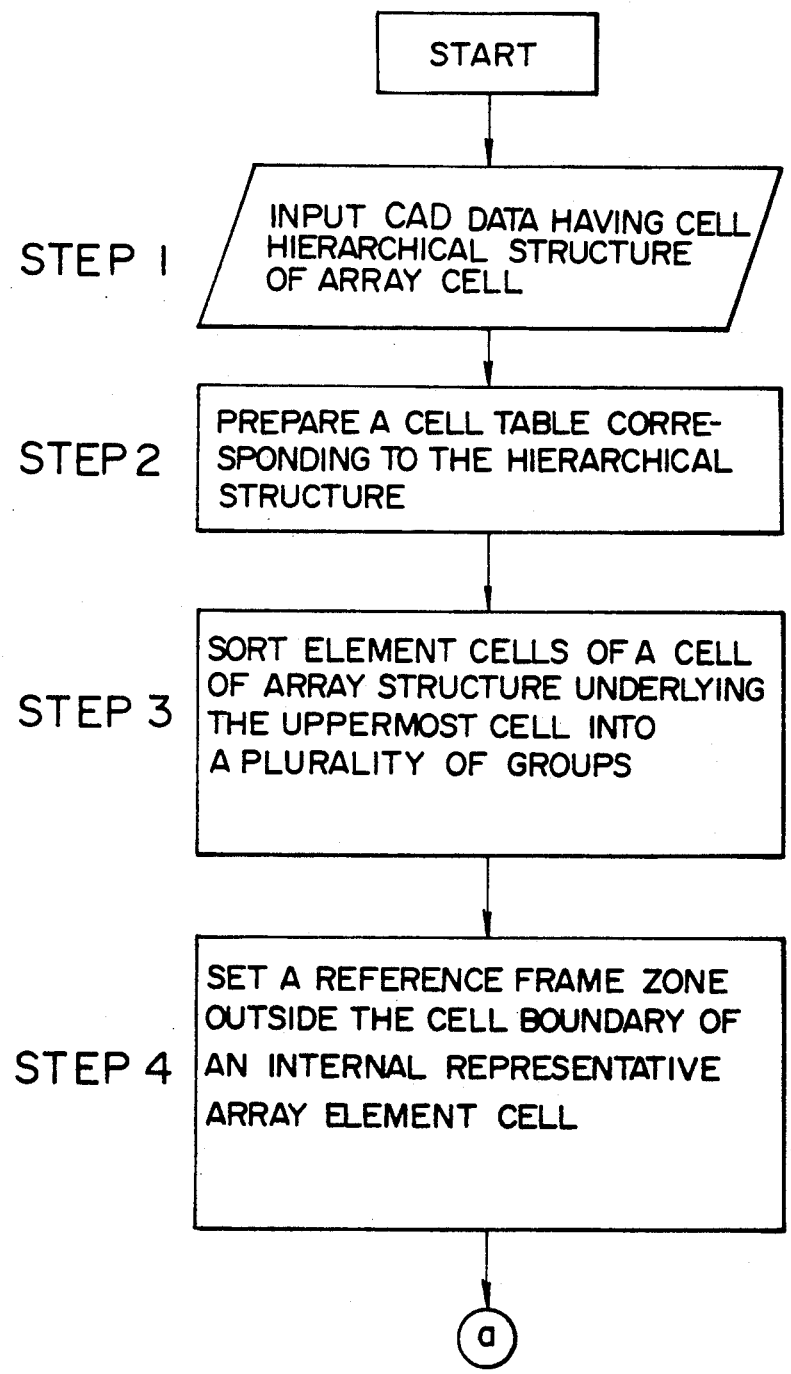
FIGS. 8A–8D are flow charts showing the operation procedure for cells of array structure in a second embodiment according to the invention.
Figure 8B:
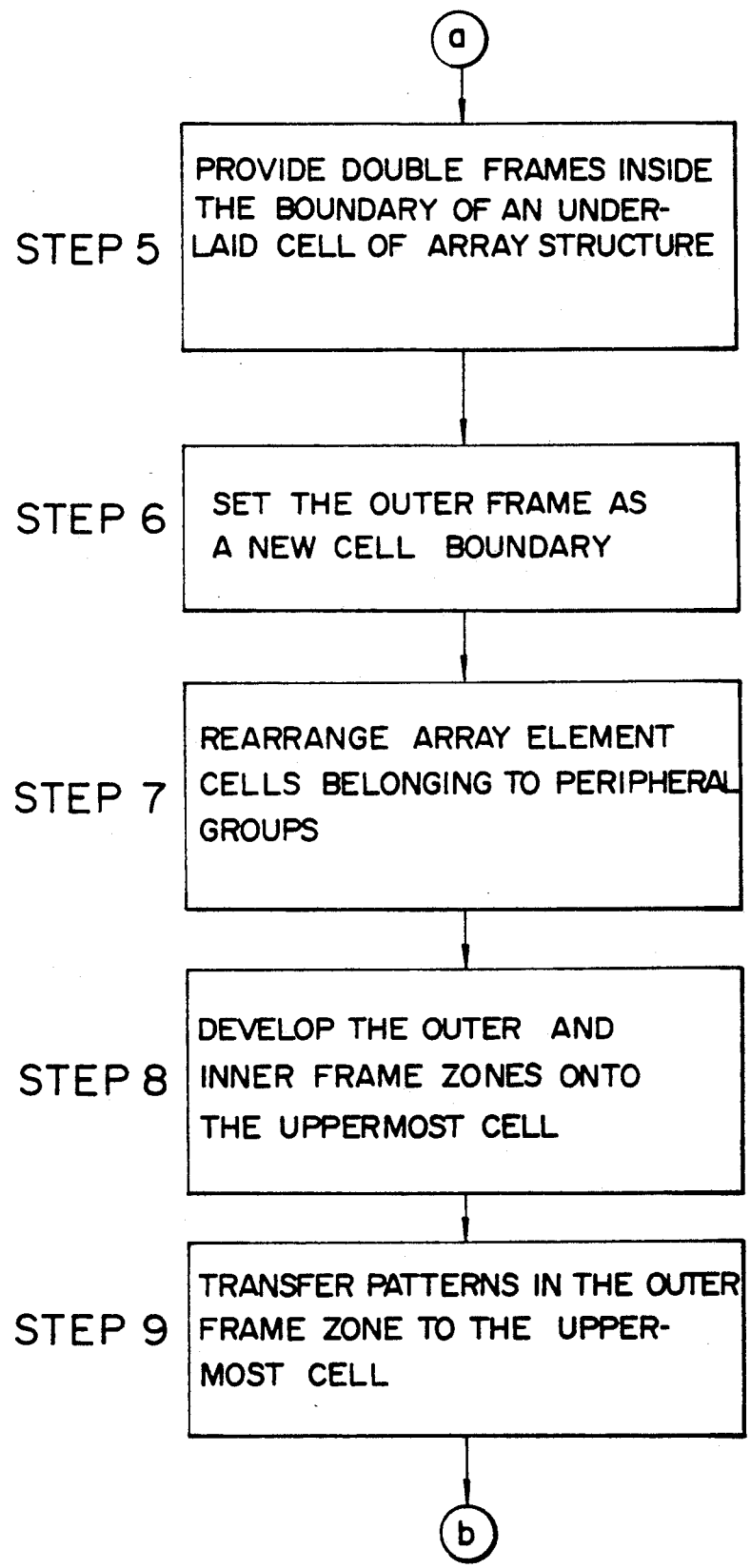
Figure 8C:
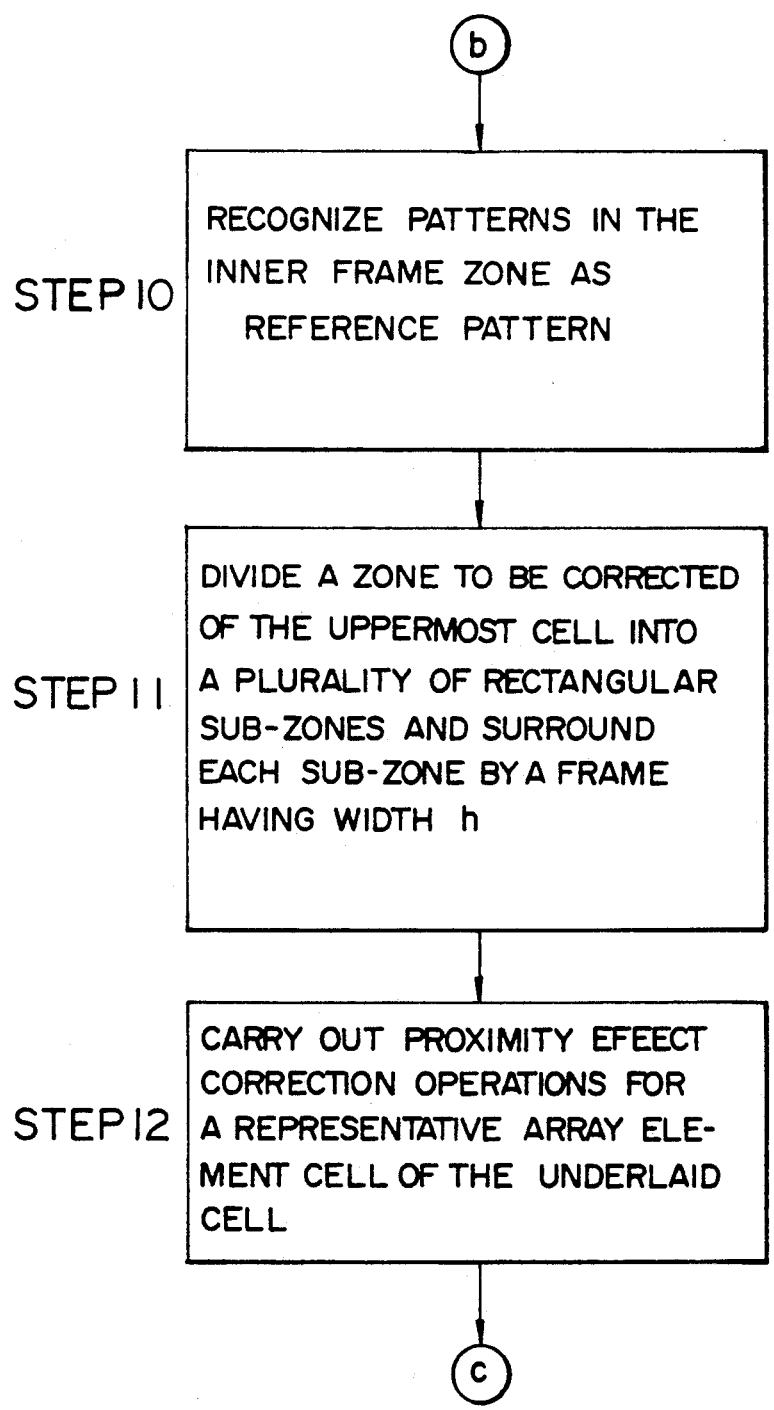
Figure 8D:
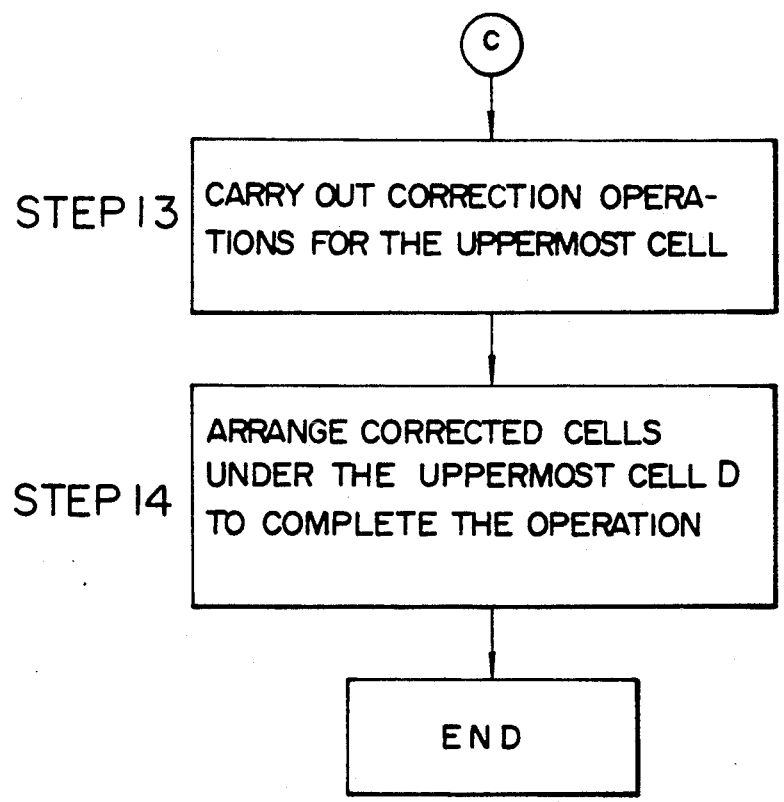

Similarly, the cell B' is extracted as illustrated in FIG. 7. A pattern zone to be corrected defined by the boundary 13 of the cell B' and the boundary 15 of the underlaid cell C' is divided into rectangular sub-zones of suitable size and each of the sub-zones is surrounded by a frame having a width of h. Representative sub-zones 36, 37 and 38 are surrounded by reference frames 39, 40 and 41. Practically, all sub-zones are surrounded by reference frame zones. The reference frame zone 39 of the sub-zone 36 contiguous to the cell boundary 13 overlaps part of the zone 19, and the reference frame zone 40 of the sub-zone 37 contiguous to the boundary 15 of the underlaid cell C' overlaps part of the zone 22. Denoted by 42 is the dividing line for formation of the sub-zones. In STEPS following STEP 11, amounts of exposure to be assigned to design patterns are optimized for individual patterns to correct proximity effects (STEP 12).

In FIG. 2, a pattern or patterns present in the outer reference frame zone 21 of the lowermost cell C' underlying the cell B' are divided into element figures which are assigned with initially estimated irradiation amounts $Q_{init}$ of zero approximation. FIG. 2 is however devoid of illustration of the patterns. The irradiation amounts $Q_{init}$ depend on such exposure parameters as the electron beam accelerating voltage and the kind and coating thickness of resist and may be set to approximate values conventionally obtained experimentally and empirically. Based on the thus obtained values, correction operations are carried out, in respect of individual sub-zones, for all patterns belonging to each sub-zone in the cell C' shown in FIG. 6 in order to determine the amount of exposure for each pattern. In this procedure, for patterns in the reference frame zone subordinated to each sub-zone, the estimated values $Q_{init}$ are presupposed equally and assigned to these patterns, or for patterns present in the reference frame zone and overlapping patterns in an adjacent sub-zone for which correction operations have already been completed, corrected exposure amounts are assigned to these patterns. Also, for patterns in the cell C' directly underlying the cell A and having the cell boundary 17 as shown in FIG. 2, the results of the aforementioned correction operations for the patterns in the cell C' underlying the cell B' and enclosed by the cell boundary 15 can be used without alternation and no correction operations are newly required for these patterns.

Subsequently, for the second hierarchical cell B', all patterns of each sub-zone which are present in a difference zone resulting from subtraction of a zone inside the boundary 15 of the cell C' from a zone inside the cell boundary 13 of the cell B' as shown in FIG. 7 are subjected to execution of correction operations as in the case of the cell C'.

Finally, for the uppermost cell A, all patterns of each sub-zone which are present in a zone inside the boundary 1 of the cell A, excepting a zone inside the boundary 13 of the second hierarchical cell B' as shown in FIG. 7 and a zone inside the boundary 17 of the cell C', are similarly subjected to execution of correction operations.

In a series of operations carried out for the cell C to the cell A, the first cycle is operated on the basis of the estimated exposure amounts Qinit presupposed for patterns in the reference frame zone but the series of operations may be effected as necessary by modifying the exposure amounts obtained from the previous series of operations and assigning the thus modified exposure amounts to the patterns in the reference frame zone. More specifically, in respect of a plurality of representative patterns present in the reference frame zone or in the sub-zone and highly descriptive of converging conditions of solutions of the series of repetitive computations or if necessary all patterns in the reference frame zone or the sub-zone, the exposure amounts determined through respective cycles of the series of correction operations are monitored so that the series of operations is reiteratively executed until E values defined by $$\left| \frac{Q_i(n+1) - Q_i(n)}{Q_i(n)} \right| = E \, (i = 1, 2, \ldots, m)$$

fall below threshold values Ecrit. In the above equation, i is an index indicative of a specified pattern, m is the total number of patterns to be monitored and n is the repetition number of a series of operations. The threshold values Ecrit depend on the exposure condition and required correction accuracy. It is sufficient that the proximity effect correction operations in STEP 12 is carried out once for the same cell, and the results of the operations can be applied to identical cells on the same hierarchy or on other hierarchies. It is not always necessary that the operations proceed from lower cell to higher cell in an orderly manner but may proceed from any cell registered in the cell table. The proximity effect correction operations for all cells registered in the cell table are completed through the processing ending with STEP 12 and thereafter, the results of the proximity correction operations for each cell are applied to all cells underlying the uppermost cell A, thereby completing the operation procedure (STEP 13).

Figure 9:
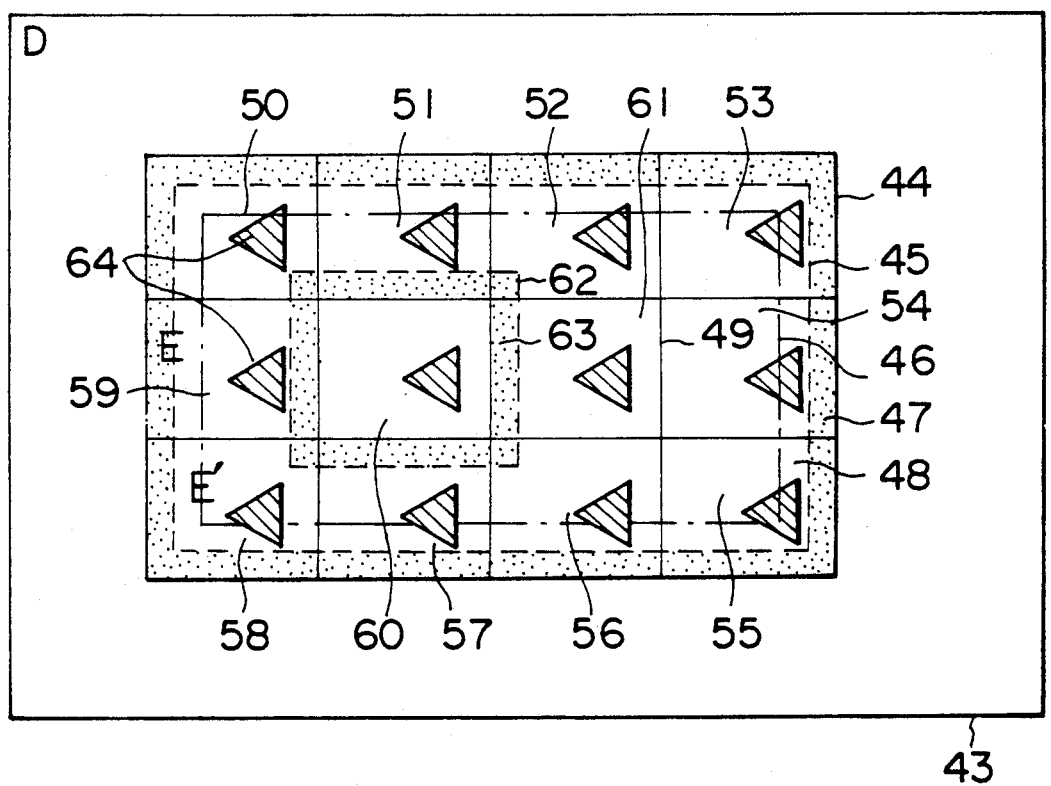
FIG. 9 is a diagram illustrating the arrangement of cells useful to explain the second embodiment.
Figure 10B:
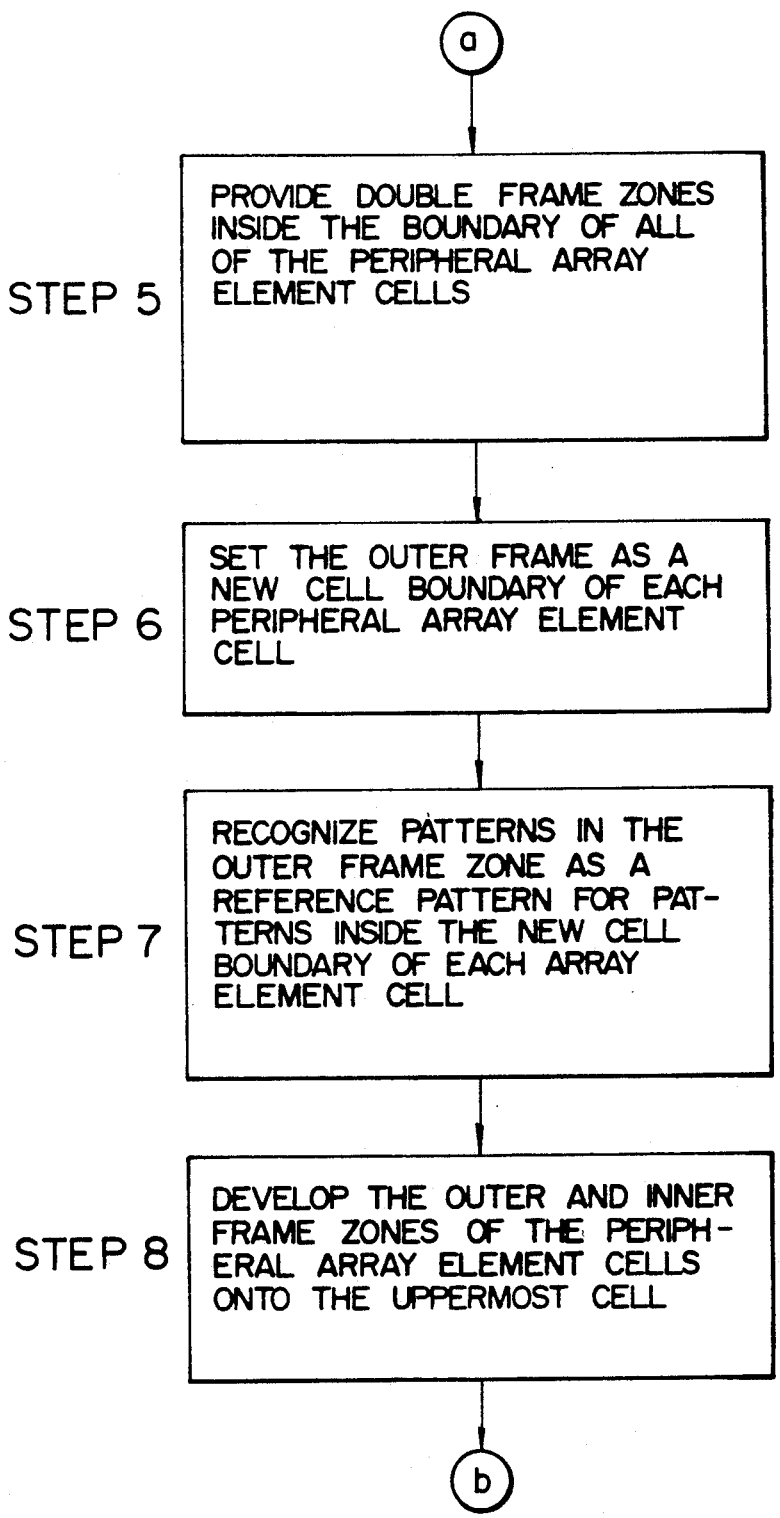
Figure 10C:
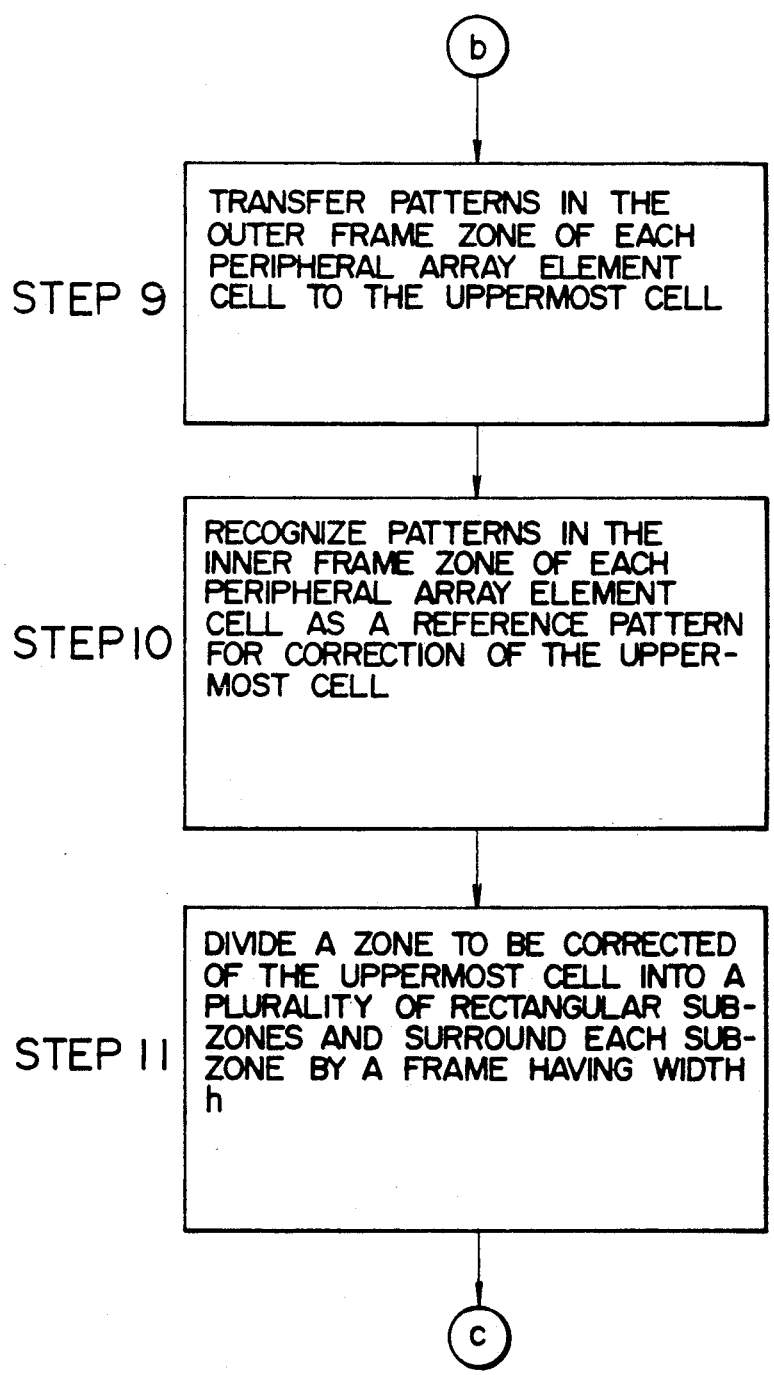

A second embodiment of the invention will now be described. FIGS. 8A–8D are flow charts showing the second embodiment applied to cells of array structure, and FIG. 9 is a diagram useful in explaining the present embodiment. Firstly, CAD data of patterns of hierarchical structure in cells inclusive of array structure cells is inputted to a computer for performing proximity effect correcting operations (STEP 1). Subsequently, as in the case of the first embodiment, a cell table corresponding to design data as shown in FIG. 9 is prepared (STEP 2). Thereafter, a pattern processing corresponding to preparation for proximity effect correction operations in STEP 3 to STEP 11 is carried out for individual array element cells in a cell having an array structure, for cells of array structure and for the uppermost cell inclusive of cells of array structure.

Referring first to FIG. 9, a cell E constituting a 4×3 array of identical element cells F 50 to 61 underlies the uppermost cell D. Each element cell F contains a pattern 64. Here, 43 designates the cell boundary of the uppermost cell D and 44 the cell boundary of the cell E in the form of the array. The array element cells F in the cell E are sorted into nine groups (STEP 3). More particularly, a group $G_C$ of the internal array element cells 609 and 61 which are not contiguous to the boundary of the cell E, a group $G_{TL}$ of the left-upper corner element cell 50, a group $G_{TR}$ of the right-upper corner element cell 53, a group $G_{BL}$ of the left-below corner element cell 58, a group $G_{BR}$ of the right-below corner element cell 55, a group $G_T$ of the element cells 51 and 52 which are present along the upper side, a group $G_B$ of the element cells 56 and 57 which are present along the lower side, a group $G_L$ of the element cell 59 present at the left side, and a group $G_R$ of the element cell 54 present at the right side.

For the array element cells F 60 and 61 belonging to the group $G_C$, each element cell is treated as a sub-zone and the boundary of a single representative array element cell, 60 in this example, is surrounded by a reference frame zone 63 defined by a reference frame 62 (STEP 4). Inside the cell boundary of the cell E in the form of the array, double inner and outer frames being mutually in nest relationship are provided (STEP 5). Here, 45 designates the outer frame and 46 the inner frame. In the cell E in the form of the array, the width of an outer frame zone 47 (dotted zone) enclosed by the cell boundary 44 and the outer frame 45 and the width of an inner frame zone 48 enclosed by the outer frame 45 and the inner frame 46 are each set to be h, the magnitude of h being set to equal a typical length affected by proximity effects. Accordingly, the cell structure is rearranged to set the outer frame 45 as the cell boundary of a new cell E' which substitutes for the original cell boundary 44 (STEP 6).

Of the array element cells F, the element cells belonging to the groups $G_{TL}$, $G_{TR}$, $G_{BL}$, $G_{BR}$, $G_T$, $G_B$, $G_L$ and $G_R$ are cut out along the outer frame 45 of cell E standing for the boundary of the cell E' to remove the dotted portion 47 so that the respective groups of the original element cells are rearranged to new element cell groups $F_{TL}$, $F_{TR}$, $F_{BL}$, $F_{BR}$, $F_T$, $F_B$, $F_L$ and $F_R$ (STEP 7). The outer and inner frame zones 47 and 48 of the cell E in the form of the array are developed onto the cell D so as to behave as lying on the same hierarchy as the cell D (STEP 8).

In this embodiment, the cell D is the uppermost cell but in the case of the cell D being not the uppermost cell, the processing of STEPS 3 to 10 shown in FIG. 1 is carried out for all different cells until the uppermost cell is ultimately processed, as explained in connection with the first embodiment.

Of the portion developed onto the uppermost cell D, a pattern (or patterns) in the outer frame zone 47 of the cell E is transferred to the cell D to behave as the one therein (STEP 9). In addition, a pattern (or patterns) in the inner frame zone 48 of the cell E is subordinated to the cell D to behave as a reference pattern zone for a pattern zone to be corrected of the cell D (STEP 10). A pattern zone to be corrected obtained by removing a zone inside the new boundary 45 of the underlaid cell E in the form of the array from a zone inside the boundary 43 of the uppermost cell D is divided into a plurality of sub-zones and each sub-zone is surrounded by a frame having a width affected by proximity effects (STEP 11).

Subsequently, as in the case of the first embodiment, amounts of exposure to be assigned to design patterns are optimized for individual patterns to correct proximity effects. For design patterns inclusive of cells of array structure as shown in FIG. 9, proximity effect correction operations are carried out as follows (STEP 12). More particularly, a pattern or patterns present in the reference frame zone 63 of the representative cell 60, i.e., the array element cell belonging to the group $G_C$ are divided into element figures which are assigned with exposure amounts Qinit of zero approximation and based on the thus obtained values, proximity effect correction operations are carried out for the patterns inside the cell boundary of the representative cell 60.

Subsequently, in respect of the pattern zone to be corrected of the uppermost cell D, correction operations are carried out for patterns in respective sub-zones as in the case of examples of FIGS. 6 and 7 (STEP 13). A series of correction operations in STEP 12 to STEP 13 is reiteratively effected until values E fall below threshold values Ecrit as described previously.

Then, the results of the proximity effect correction operations carried out for the representative cell 60 in the cell of array structure are equivalently applied to all of other array element cells belonging to the group $G_C$ (in this example, array element cell 61). Thereafter, in respect of the array element cells belonging to the groups $G_{TL}$, $G_{TR}$, $G_{BL}$, $G_{BR}$, $G_T$, $G_B$, $G_L$ and $G_R$, the results of the correction operations obtained for the group $G_C$ are applied to zones of the cell groups $F_{TL}$, $F_{TR}$, $F_{BL}$, $F_{BR}$, $F_T$, $F_B$, $F_L$ and $F_R$ in which original zones of the element cells are removed of the dotted zone 47 equaling an overlapping portion between the individual element cells and the outer frame zone of the cell E, thus completing the operation procedure (STEP 14). As mentioned, herein noted is that 48 indicates the inner frame zone in cell E, 49 dividing line defining the boundary of element cell F, 50 to 59 peripheral array element cell F, 60 and 61 internal array element cell F, 62 frame subordinated to internal array element cell F, 63 reference frame zone of element cell F, and 64 pattern of element cell F.

Figure 11:
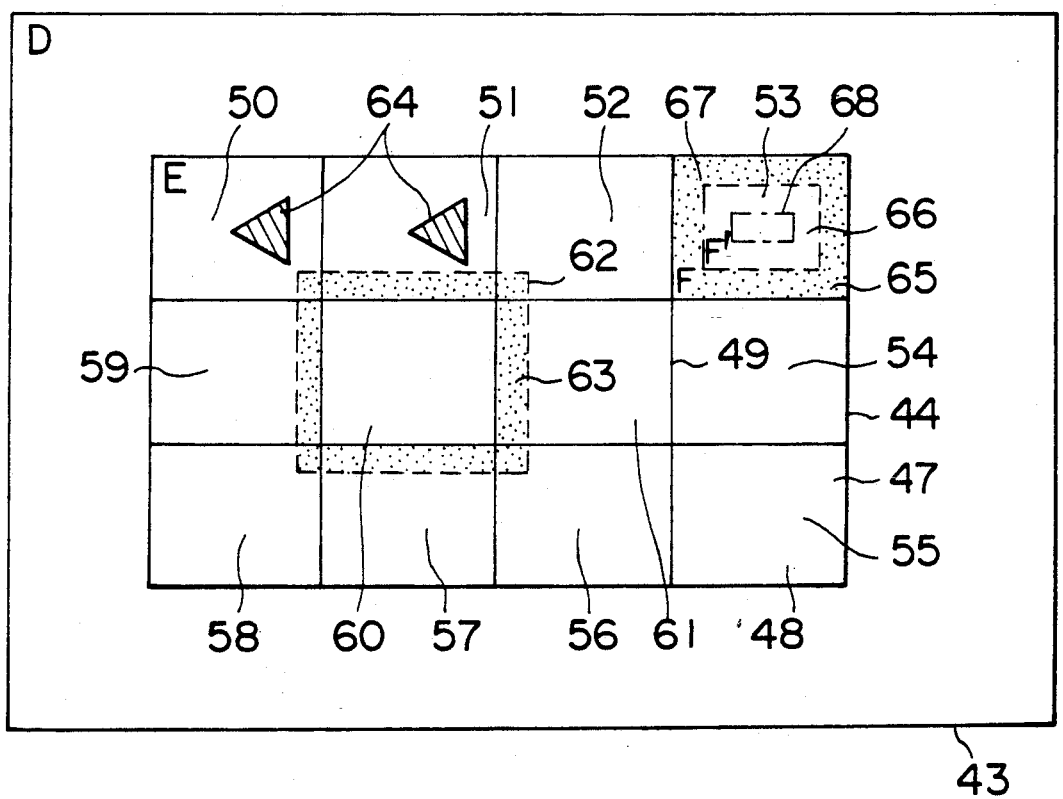
FIG. 11 is a diagram illustrating the cell arrangement useful to explain the third embodiment.

A third embodiment of the invention will now be described. FIGS. 10A–10D are flow charts showing the third embodiment applied to cells of array structure different from those of the second embodiment, and FIG. 11 is a diagram useful to explain the present embodiment. Firstly, CAD data of patterns of hierarchical structure in cells inclusive of array structure cells is inputted to a computer for performing proximity effect correcting operations (STEP 1). Subsequently, as in the case of the first embodiment, a cell table corresponding to design data as shown in FIG. 11 is prepared (STEP 2). Thereafter, a pattern processing corresponding to preparation for proximity effect correction operations in STEP 3 to STEP 11 is carried out for individual array element cells in a cell having an array structure, cells of array structure and the uppermost cell inclusive of cells of array structure.

Referring first to FIG. 11, a cell E constituting a 4×3 array of identical element cells F 50 to 61 underlies the uppermost cell D. Each element cell F contains a pattern 64. Here, 43 designates the cell boundary of the uppermost cell D and 44 the cell boundary of the cell E in the form of the array. The array element cells F in the cell E are sorted into two groups (STEP 3). More particularly, a group $G_C$ of the internal array element cells 60 and 61 which are not contiguous to the boundary of the cell E, and a group $G_P$ of other peripheral array element cells 50 to 59. For the array element cells F 60 and 61 belonging to the group $G_C$, each element cell is treated as a sub-zone and the boundary of a single representative array element cell, 60 in this example, is surrounded by a reference frame zone 63 defined by a reference frame 62 (STEP 4). In respect of the peripheral array element cells F 50 to 59 belonging to the group $G_P$, double inner and outer frames being mutually in nest relationship are provided inside the cell boundary of each array element cell (STEP 5). In FIG. 11, this condition is illustrated for only a representative array element cell 53 by designating an outer frame at 67 and an inner frame at 68. The width of an outer frame zone 65 (dotted zone) enclosed by the boundary of the sub-zone and the outer frame 67 and the width of an inner frame zone 66 enclosed by the outer frame 67 and an inner frame 68 are each set to be h, the magnitude of h being set to equal a typical length affected by proximity effects.

The cell structure is rearranged such that the outer frame 67 is set as a new cell boundary which substitutes for the original boundary and a new cell F' for the cell F is registered (STEP 6). A pattern in the outer frame zone 65 is recognized as a reference pattern used when performing proximity effect correction operations for a pattern (or patterns) inside the new cell boundary (STEP 7). Then, the outer and inner zones are developed onto the cell D so as to behave as lying on the same hierarchy as the cell D (STEP 8).

In this embodiment, the cell D is the uppermost cell but in the case of the cell being not the uppermost cell, the processing of STEP 3 to STEP 10 shown in FIG. 1 is carried out for all different cells until the uppermost cell is ultimately processed, as explained in connection with the first embodiment. Of the portion developed onto the uppermost cell D, a pattern (or patterns) in the outer frame zone 65 is transferred to the cell D to behave as the one therein (STEP 9). In addition, a pattern (or patterns) in the inner frame 66 is subordinated to the cell D to behave as a reference pattern zone for a pattern zone to be corrected of the cell D (STEP 10). The processing of STEP 5 to STEP 10 is carried out for only one, representative cell F' belonging to the group $G_P$ and the results of operations may be applied equivalently to other array element cells belonging to the group $G_P$.

A pattern zone to be corrected of the uppermost cell D obtained by removing from a zone inside the boundary 43 of the uppermost cell D two kinds of zones, of which one corresponds to zones inside the cell boundaries of the array element cells F 60, 61 and the other corresponds to zones inside the outer frames of the peripheral array element cells 50 to 59, is divided into a plurality of sub-zones and each sub-zone is surrounded by a frame zone having a width affected by proximity effects (STEP 11).

Subsequently, as in the case of the first embodiment, amounts of exposure to be assigned to design patterns are optimized for individual patterns to correct proximity effects. For design patterns inclusive of cells of array structure as shown in FIG. 11, proximity effect correction operations are carried out as follows. More particularly, a pattern or patterns present in the reference frame zone 63 of the representative internal array element cell 60 i.e., the array element cell belonging to the group $G_C$ are divided into element figures which are assigned with exposure amounts Qinit of zero approximation and based on the thus obtained values, proximity effect correction operations are carried out for the patterns in the sub-zone (STEP 12).

Subsequently, a pattern or patterns present in the reference frame zone or outer frame zone 65 of the representative peripheral array element cell 53 belonging to the group $G_P$ are divided into element figures which are assigned with exposure amounts Oinit of zero approximation and based on the thus obtained values, proximity effect correction operations are carried out for patterns inside the new cell boundary 67 (STEP 13). Subsequently, in respect of the pattern zone to be corrected of the uppermost cell, correction operations are carried out for patterns in respective sub-zones as in the case of examples of FIGS. 6 and 7 (STEP 14).

A series of correction operations in STEPS 12 to 14 is reiteratively effected until values E fall below threshold values Ecrit as described previously. Then, the results of the proximity effect correction operations carried out for the representative array element cell 60 belonging to the group $G_C$ are equivalently applied to all of other array element cells belonging to the group $G_C$ (in this example, array element cell 61). Thereafter, the results of the proximity correction operations carried out for the representative array element cell 53 belonging to the group $G_P$ are equivalently applied to all of other array element cells belonging to the group $G_P$ (in this example, array element cells 50 to 52 and 54 to 59), thus completing the operation procedure (STEP 15).

Figure 12A:
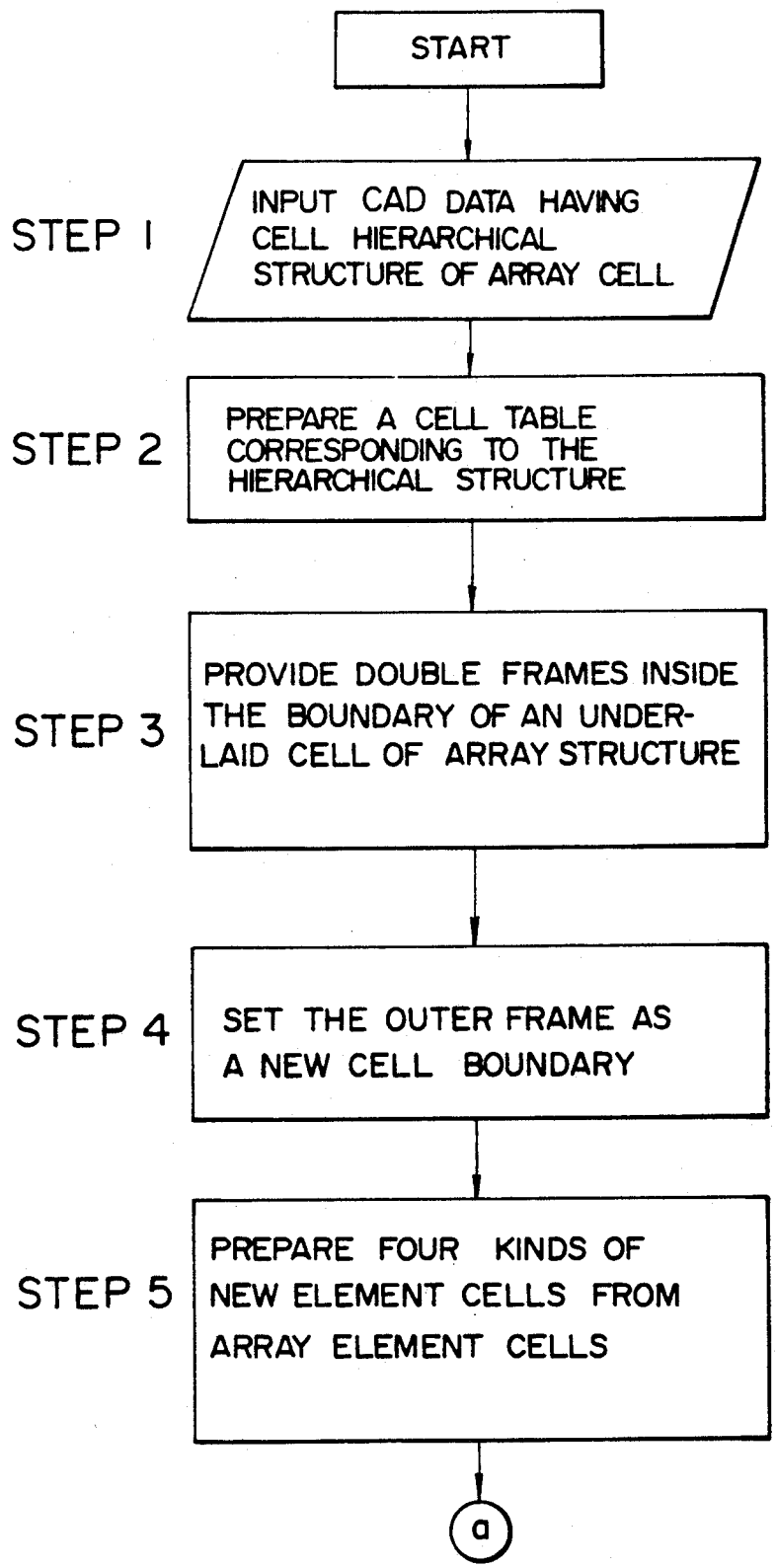
FIGS. 12A-12D are flow charts showing the operation procedure for array cells in a fourth embodiment according to the invention.
Figure 12B:
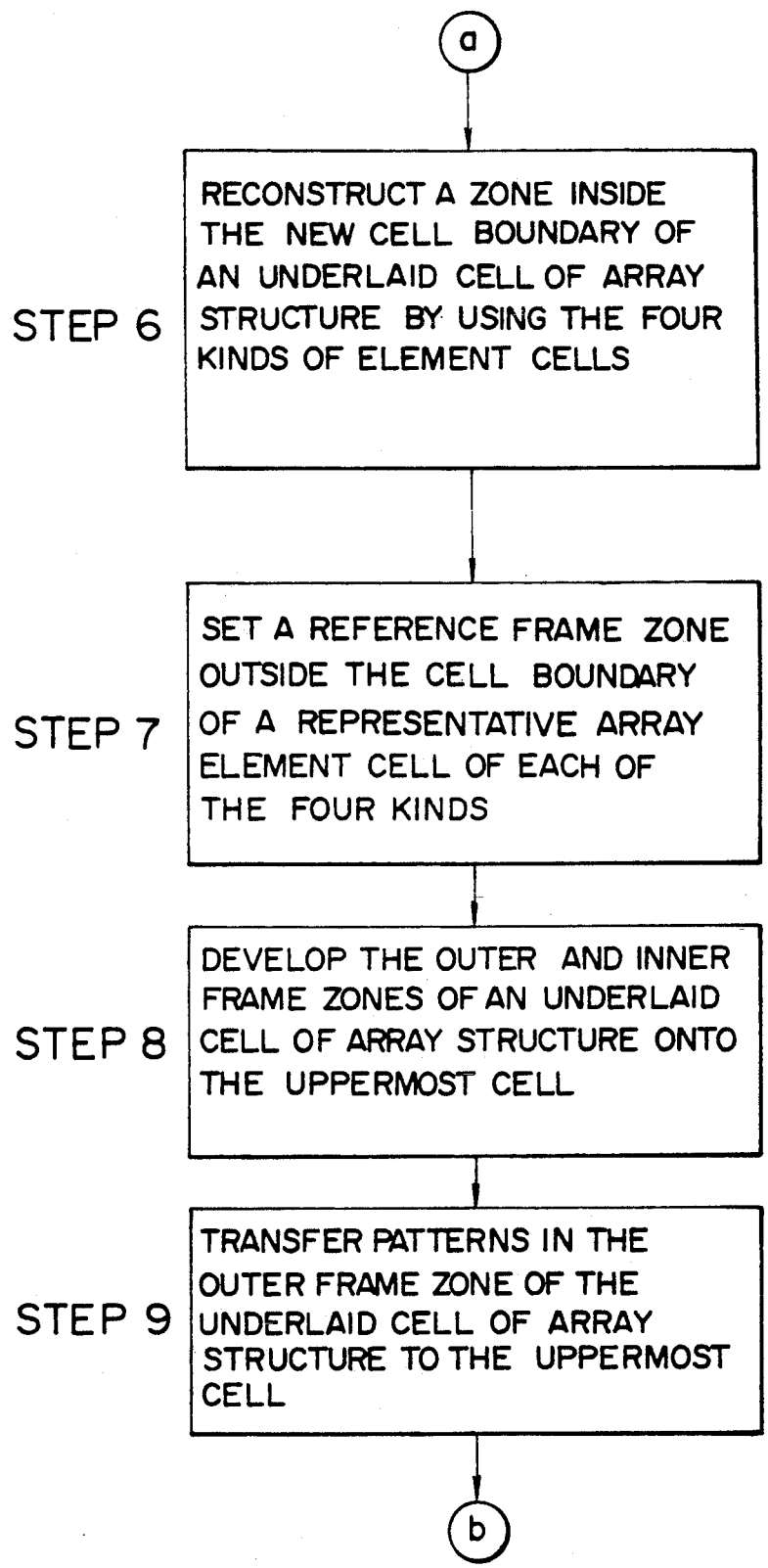
Figure 12C:
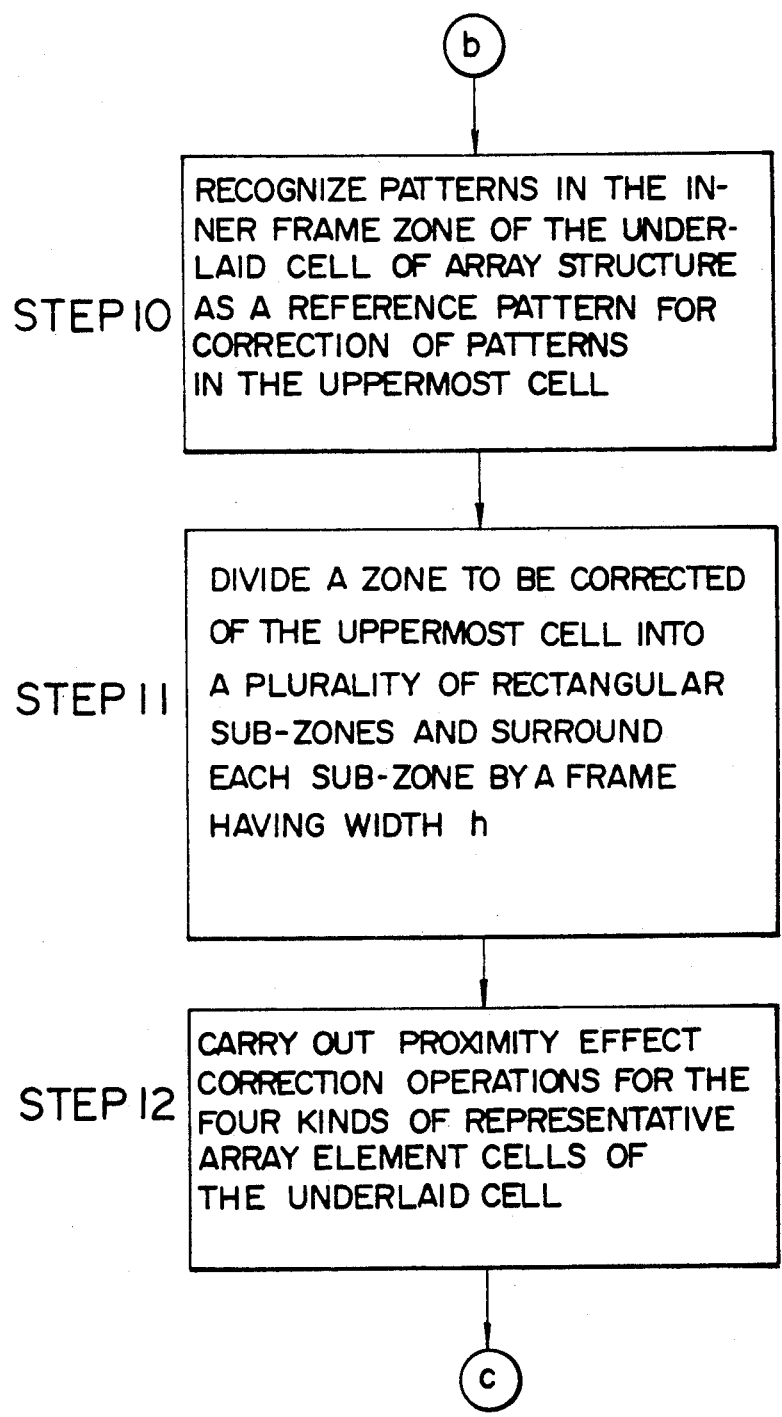
Figure 12D:
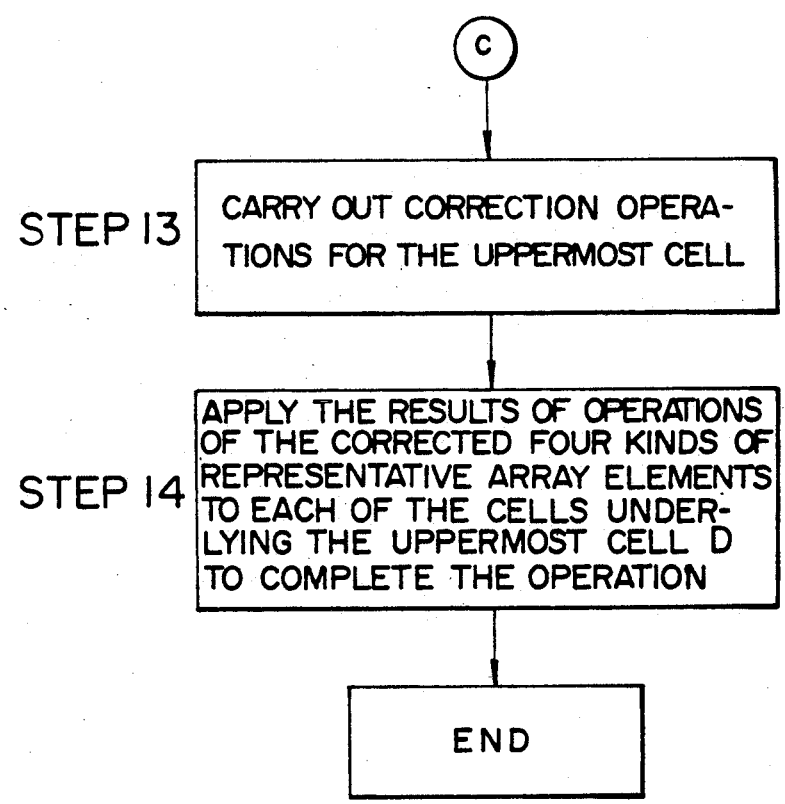
Figure 13:
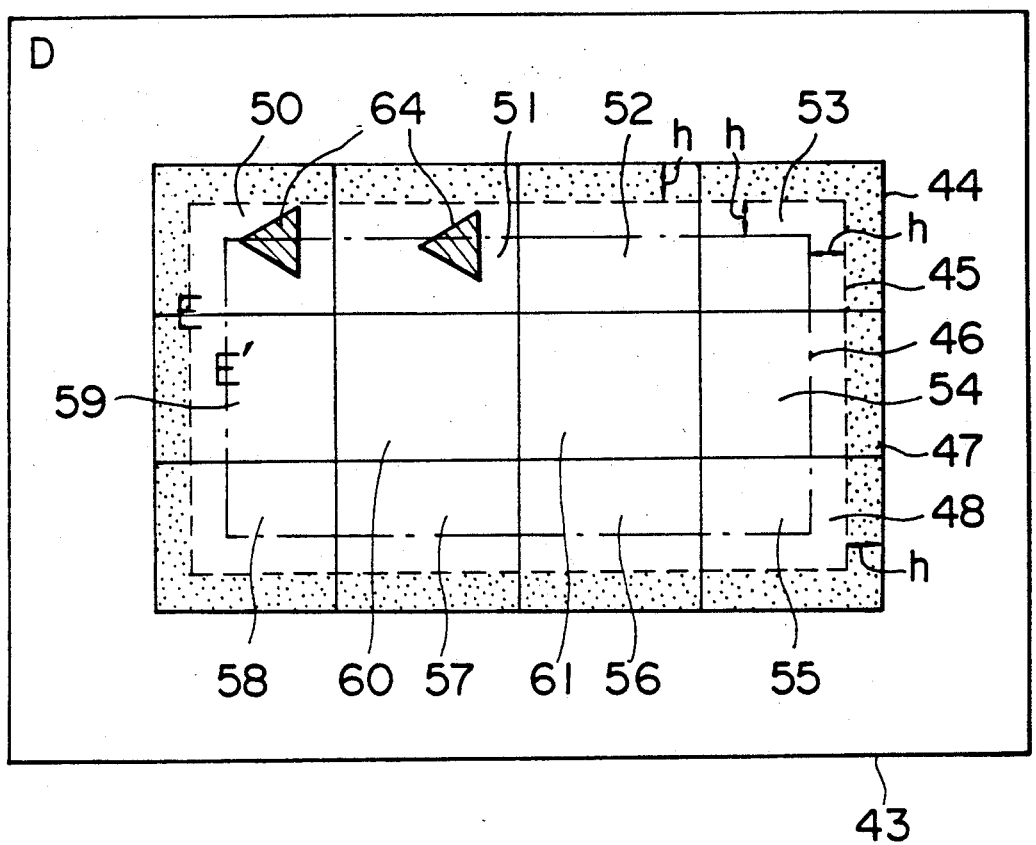
FIG. 13 is a diagram illustrating the cell arrangement useful to explain the fourth embodiment.
Figure 14A:
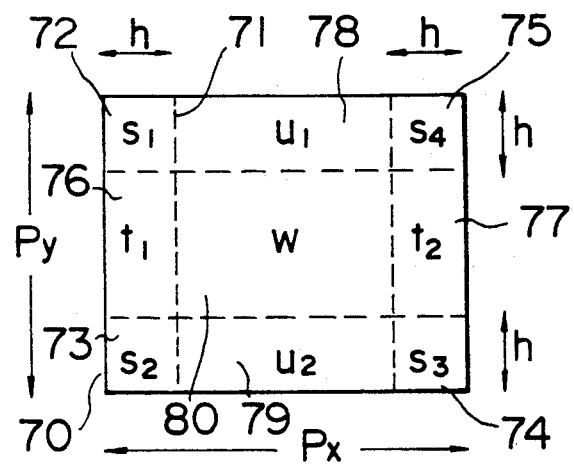
FIGS. 14A and 14B are diagrams for explaining the manner of reconstructing array element cells in the fourth embodiment.
Figure 14B:
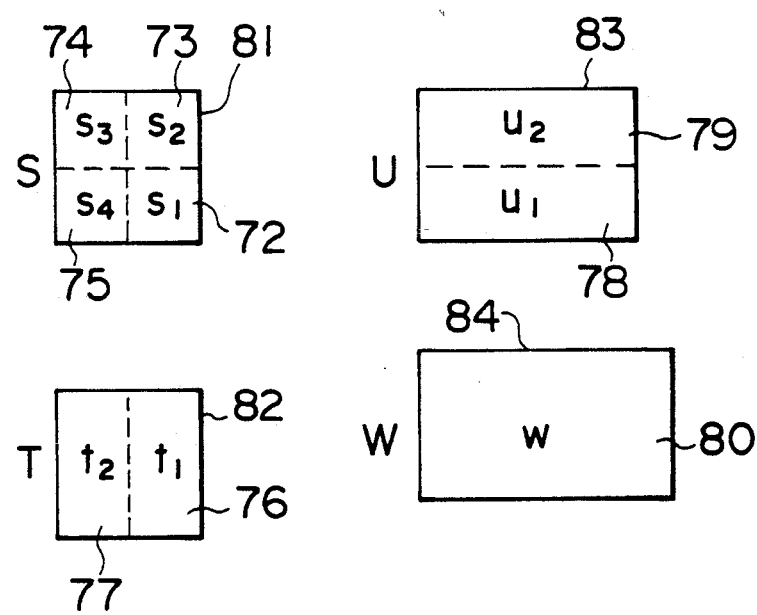
Figure 15:
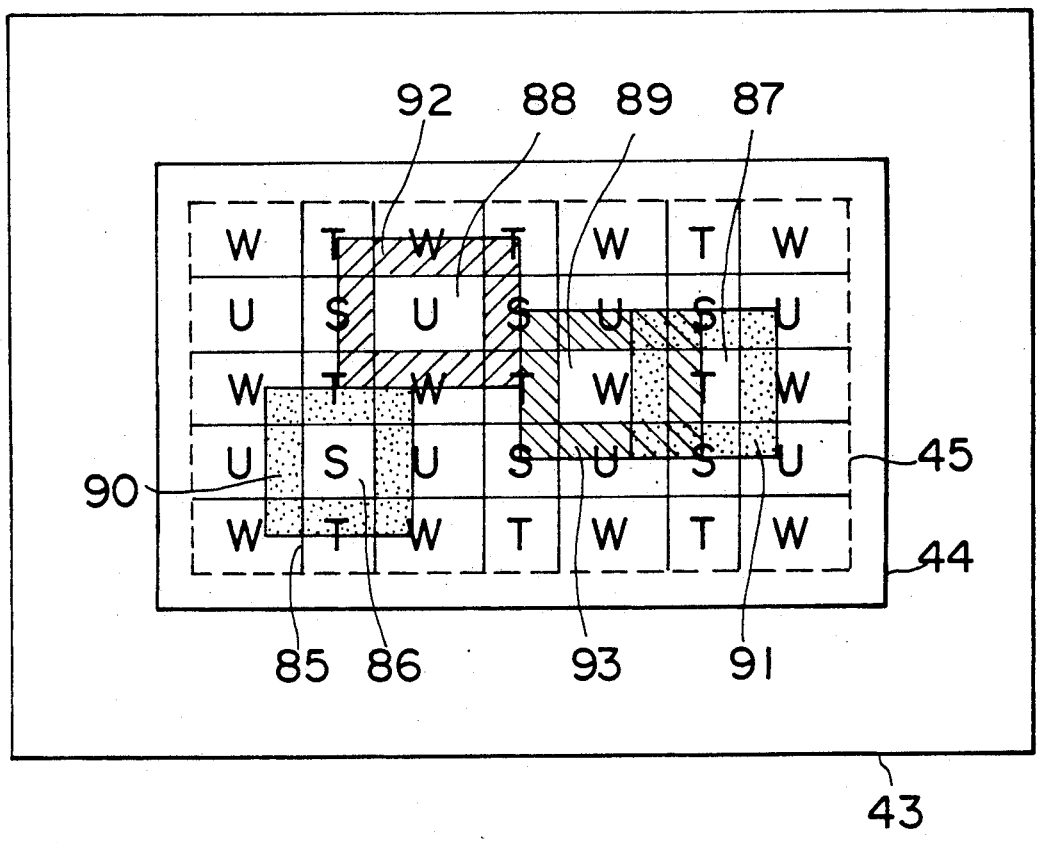
FIG. 15 is a diagram illustrating the arrangement of reconstructed element cells useful to explain the fourth embodiment.
Figure 16:
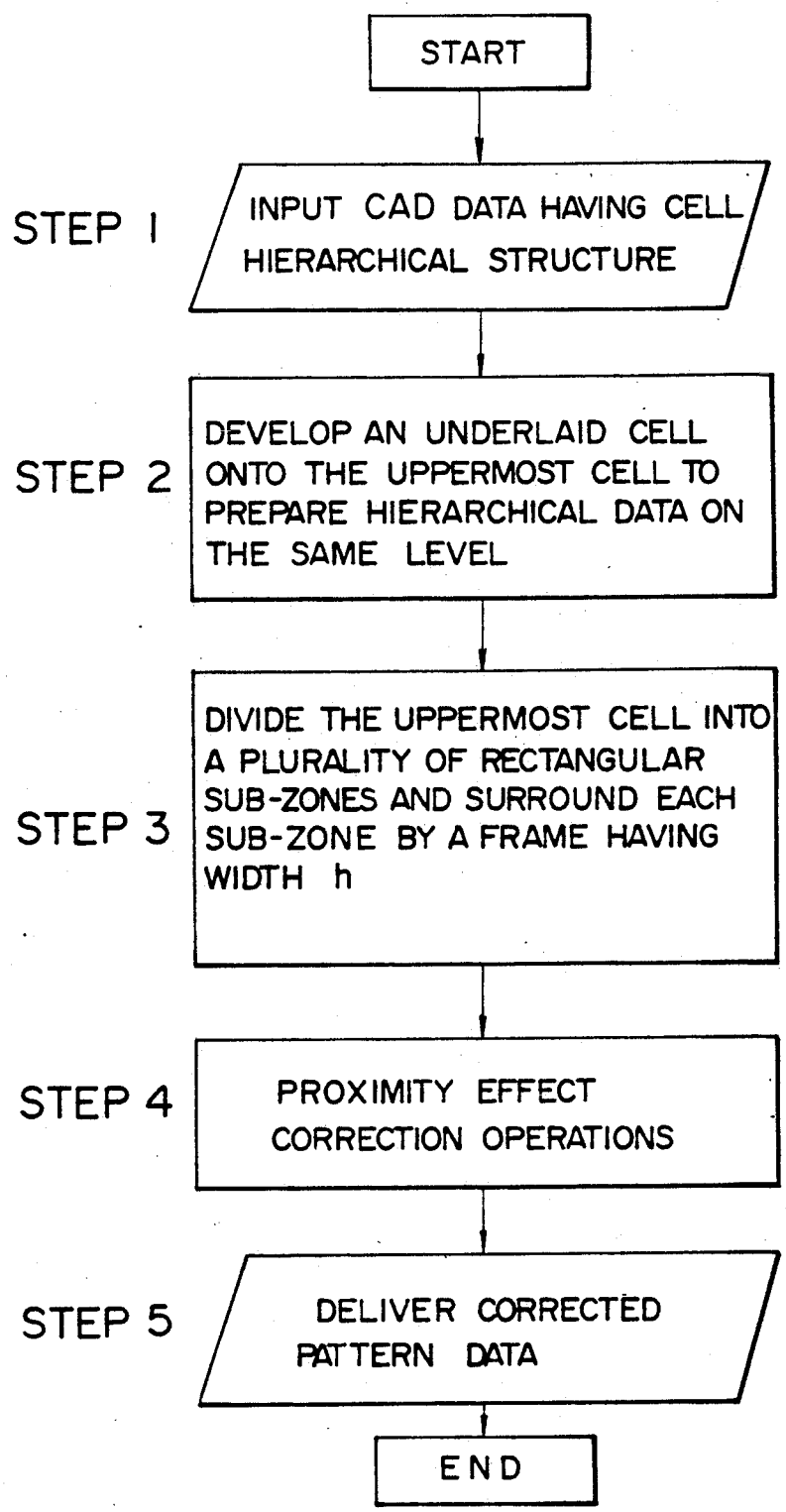
FIG. 16 is a flow chart showing the procedure according to the prior art sub-zone frame method.

A fourth embodiment of the invention will now be described. FIGS. 12-12D are flow charts showing the fourth embodiment applied to cells of array structure different from those of the second and third embodiments, and FIGS. 13 to 15 are diagrams useful to explain the present embodiment. Firstly, CAD data of patterns of hierarchical structure in cells inclusive of array structure cells is inputted to a computer for performing proximity effect correcting operations (STEP 1). Subsequently, as in the case of the first embodiment, a cell table corresponding to design data as shown in FIG. 13 is prepared (STEP 2). Thereafter, a pattern processing corresponding to preparation for proximity effect correction operations in STEP 3 to STEP 11 is carried out for individual array element cells in a cell having an array structure, cells of array structure and the uppermost cell inclusive of cells of array structure.

Referring to FIG. 13, a cell E constituting a 4×3 array of identical element cells F 50 to 61 underlines the uppermost cell D. Each element cell F contains a pattern 64. Here, 43 designates the cell boundary of the uppermost cell D and 44 the cell boundary of the cell E in the form of array. Inside the cell boundary of the cell E in the form of the array, double inner and outer frames being mutually in nest relationship are provided (STEP 3). Here, 45 designates the outer frame and 46 the inner frame. In the cell E in the form of the array, the width of an outer frame zone 47 (dotted zone) enclosed by the cell boundary 44 and the outer frame 45 and the width of an inner frame zone 48 enclosed by the outer frame 45 and the inner frame 46 are each set to be h, the magnitude of h being set to equal a typical length affected by proximity effects. Accordingly, the cell structure is rearranged to set the outer frame 45 as the cell boundary of a new cell E' which substitutes for the original cell boundary 44 (STEP 4).

The array element cells F in the cell E are rearranged using four kinds of new element cells S, T, U and W. A method of rearrangement is diagrammatically shown in FIG. 14. Denoted by 70 is the cell boundary of the array element cell F, and 71 line for dividing a zone inside the array element cell into nine zones. Firstly, the element cell F having a width Px and a height Py as shown in FIG. 14A is divided into nine zones of a zone S1 present at left-upper corner 72 of the array element cell and having a width h and a height h, a zone S2 present at left-below corner 73 and having a width h and a height h, a zone S3 at right-below corner 74 having a width h and a height h, a zone S4 at right-upper corner 75 having a width h and a height h, a zone t1 present at position 76 between the left corner zones S1 and S2 and having a width h and a height Py−2h, a zone t2 present at position 77 between the right corner zones S3 and S4 and having a width h and a height Py−2h, a zone u1 present at position 78 between the upper corner zones S1 and S4 and having a width Px−2h and a height h, a zone u2 present at position 79 between the lower corner zones S2 and S3 and having a width Px−2h and a height h, and a zone w at central position enclosed by the zones S1, t1, S2, u2, S3, t2, S4, and u1. Denoted by 71 is the dividing line.

Then, for example, the array element cell F 60 centrally positioned in FIG. 13 is taken for a target element cell. A zone S2 at 73 of the target element cell, a zone S3 at 74 of an element cell F contiguously leftwardly of the target element cell, a zone S1 at 72 of an element cell F contiguously downwardly of the target element cell, and a zone S4 at 75 of an element cell F making contact to one point of the left-lower corner of the target element cell are taken and these four zones are put together as shown in FIG. 14B to prepare a cell S. Denoted by 81 is the boundary of this cell S.

Subsequently, a zone u1 at 78 of the target element cell and a zone u2 at 79 of an element cell F contiguously upwardly of the target element cell are taken and these two zones are put together as shown in FIG. 14B to prepare a cell U. Denoted by 83 is the boundary of this cell U.

Thereafter, a zone t1 at 76 of the target element cell and a zone t2 at 77 of an element cell F contiguously leftwardly of the target element cell are taken and these two zones are put together as shown in FIG. 14B to prepare a cell T. Denoted by 82 is the boundary of this cell T.

Finally, a zone w at 80 of the target element cell is registered as a cell W as shown in FIG. 14B (STEP 5). Zone W is present at center in the array element cell and having width Px−2h and height Py−2h. Denoted by 84 is the boundary of this cell W.

Referring to FIG. 15, zone inside the cell boundary of the cell E' is reconstructed using the new element cells S, T, U and W (STEP 6). These cells, S, T, U and W are mutually bounded with the cell boundary designated at 85.

Subsequently, one representative array element cell is extracted from each of the four kinds of array element cells and the cell boundary of the representative array element is surrounded by a reference frame zone (STEP 7). In FIG. 15, reference numerals 86, 87, 88 and 89 designate representative element cells of the cells S, T, U and W, respectively, and reference numerals 90, 91, 92 and 93 designate reference frame zones of the representative element cells S, T, U and W, respectively.

The outer and inner frame zones 47 and 48 of the cell E in the form of array are developed onto the cell D so as to behave as lying on the same hierarchy as the cell D (STEP 8). In this embodiment, the cell D is the uppermost cell but in the case of the cell D being not the uppermost cell the processing of STEPS 3 to 10 shown in FIG. 1 is carried out for all different cells until the uppermost cell D is ultimately processed, as explained in connection with the first embodiment. Of the portion developed onto the uppermost cell D, a pattern (or patterns) in the outer frame zone 47 of the cell E is transferred to the cell D to behave as the one therein (STEP 9). In addition, a pattern (or patterns) in the inner frame zone 48 of the cell E is subordinated to the cell D to behave as a reference pattern zone for a pattern zone to be corrected of the cell D (STEP 10). A pattern zone to be corrected obtained by removing a zone inside the ne cell boundary 45 of the underlaid cell E in the form of the array from a zone inside the boundary 43 of the uppermost cell D is divided into a plurality of sub-zones and each sub-zone is surrounded by a frame having a width affected by proximity effects (STEP 11).

Subsequently, as in the case of the first embodiment, amounts of exposure to be assigned to design patterns are optimized for individual patterns to correct proximity effects. For design patterns inclusive of cells of array structure as shown in FIG. 13, proximity effect correction operations are carried out as follows. More particularly, a pattern or patters present in the respective reference frame zones 90, 91, 92 and 93 of the respective representative array element cells S 86, T 87, U 88, and W 89 are divided into element figures which are assigned with exposure amounts Qinit of zero approximation and based on the thus obtained values, proximity effect correction operations are carried out for patterns inside the cell boundary of the respective representative cells 86, 87, 88 and 89 (STEP 12).

Subsequently, in respect of the pattern zone to be corrected of the uppermost cell D, correction operations are carried out for patterns in respective sub-zones as in the case of examples of FIGS. 6 and 7 (STEP 13). A series of correction operations in STEP 12 to STEP 13 is reiterratively effected until values E fall below threshold values Ecrit as described previously. Then, the results of the proximity effect correction operations carried out for the respective representative cells 86, 87, 88 and 89 in the cells of array structure are equivalently applied to all of array element cells belonging to other individual cells S, T, U and W, thus completing the operation procedure (STEP 14).

As has been described, since in the first to fourth embodiments the operation processing is carried out in unit of cell on each hierarchy, the amount of processing data per operation cycle can be decreased as compared to the prior art in which the operation processing is effected after completion of development of cells belonging to all hierarchies, and the capacity of requisite working file can be reduced.

Further, in respect of identical cells in design data, even if they belong to any hierarchies, a pattern processing corresponding to preparation of proximity effect correction operations and the proximity correction operations are carried out for only one representative cell of the identical cells and the results of the correction operations can be applied equally to other identical cells, thereby reducing the operation processing time considerably.

Further, in respect of cells having no array structure, if the arrangement of patterns in a cell has two-dimensional periodicity, the cell may be reconstructed as a set of a plurality of array element cells and thereafter the second, third or fourth embodiment may be applied. If in the second, third and fourth embodiments the size of an array element cell is too large to be the unit of one cycle processing, means may be provided by which the array element cell is further divided into a plurality of sub-zones and correction is carried out for each of these sub-zones of the array element cell.

The first, second, third and fourth embodiments have been described by referring to the number of cell hierarchies in design data being 3 in maximum but the invention may similarly be applied to the case of the number of hierarchies being two or more. The invention may also be applied in a similar manner to the case where a plurality of kinds of cells including cells having no array structure and cells having array structure belong to any hierarchies.

In addition, in the foregoing embodiments, the amount of exposure to be irradiated on each pattern is adjusted to an optimum value but the invention may be practiced similarly by adjusting the shape and the size of patterns and element figures optimumly. The foregoing embodiments have been described as being applied to the electron beam direct writing for illustration purpose only but the proximity effect correcting method of the invention may also be applied in a similar manner to proximity effect phenomena occurring in ion beam direct writing and light exposure.

As is clear from the foregoing description, according to the invention, in respect of design data of cells having hierarchical structure, proximity effect correction operations are carried out for each hierarchy and each cell while maintaining the cell hierarchical structure to reduce the amount of processing data of one cycle, ensuring that pattern data of a large-sized ultra-LSI chip can be processed within a short period of time by using a resonable amount of magnetic disc resources. As described above, the present invention attains drastically beneficial effects in proximity effect correction.

We claim:

1. A method of writing a pattern on a semiconductor sample based upon a resist pattern involving various design patterns by application of a charged-particle beam or light, said pattern being for use in manufacture of a semiconductor integrated circuit device having circuit portions corresponding to said pattern, said method comprising:
   (a) obtaining pattern data representing design patterns included in a pattern;
   (b) developing said pattern data such that said design patterns are arranged in cells having a hierarchical relationship and corresponding to exposure patterns on the sample to be exposed to a charged-particle beam or light;

(c) correcting said pattern data for proximity effects resulting from exposing resins coated on the sample to a charged-particle beam or to light by:
  (i) providing a first frame zone having a predetermined width inside a boundary of each cell;
  (ii) providing a second frame zone having a predetermined width inside said first frame zone; and
  (iii) performing proximity effect correction operations to obtain a proximity-effect-corrected pattern such that a pattern in said second frame zone and a pattern inside said second frame zone are used as a pattern to be corrected and a pattern in said first frame zone is used as a reference pattern when correcting pattern data in said each cell for proximity effects and a pattern in said first frame zone in said each cell is added to the pattern to be corrected and a pattern in said second frame zone in said each cell is used as a reference pattern when correcting pattern data in a cell directly overlying said each cell for proximity effect; and
(d) writing said sample in accordance with said proximity-effect-corrected pattern.

2. A method according to claim 1 wherein in step (c) (iii) in respect of a plurality of identical cells, proximity effect correction operations are carried out for one of said identical cells, and the results of the proximity effect correction operations are applied to other identical cells.

3. A method according to claim 1 wherein in step (c) (iii), in respect of a cell of array structure having basic unit in the form of an element cell, all element cells enclosed by a series of element cells in said array structure cell are each provided with a frame zone present outside its boundary and having a predetermined width, and proximity effect correction operations are performed, when correcting pattern data in said enclosed element cell for proximity effects, such that pattern data in said enclosed element cell are all used as a pattern to be corrected and pattern data in said frame zone outside said enclosed element cell is used as a reference pattern.

4. A method according to claim 3 wherein the predetermined width of said frame zone is longer than a typical length affected by proximity effects which is equivalent to scattering length of back scattered electrons.

5. A method according to claim 3 wherein when, in respect of a cell having no array structure, patterns in said cell are arranged two-dimensionally periodically, said cell is reconstructed as a set of a plurality of array element cells and thereafter proximity effect correction operations are carried out.

6. A method according to claim 3 further comprising the step of further dividing each array element cell in the cell having array structure into a plurality of sub-zones and correcting patterns in each sub-zone of said array element cell for proximity effects.

7. A proximity effect correction method according to claim 1 wherein in step (c) (iii) in respect of a cell having a predetermined size, proximity effect correction operations are carried out for all patterns excepting those in the first frame zone inside the boundary of said cell such that a zone inside said first frame zone is divided into a plurality of sub-zones, each sub-zone is provided with a third frame zone present outside its boundary and having a predetermined width, pattern data in said each sub-zone are all used as a pattern to be corrected and a pattern in said third frame zone is used as a reference pattern.

8. A method according to claim 7 wherein the predetermined width of said third frame zone is longer than a typical length affected by proximity effects which is equivalent to scattering length of back scattered electrons.

9. A method according to claim 1 wherein the predetermined width of each of said first and second frame zones is longer than a typical length affected by proximity effects which is equivalent to scattering length of back scattered electrons.

10. A method of writing a pattern on a semiconductor sample based upon a resist pattern involving various design patterns by application of a charged-particle beam or light, said pattern being for use in manufacture of a semiconductor integrated circuit device having circuit portions corresponding to said pattern, said method comprising:
(a) obtaining pattern data representing design patterns included in a pattern;
(b) developing said pattern data such that said design patterns are arranged in cells in an array having a basic unit in the form of an element cell;
(c) correcting said pattern data for proximity effects resulting from exposing resins coated on the sample to the charged-particle beam or to light by:
  (i) dividing an element cell into nine rectangular zones in 3×3 matrix, and defining a second cell by putting together four different rectangular zones which are contiguous to each other and at corners of four different element cells contiguous to each other, defining third and fourth cells by putting together two different rectangular zones which are contiguous to each other and at sides of different element cells, and defining a first cell with a central rectangular zone of said element cell;
  (ii) providing each of said first to fourth cells with a frame zone having a predetermined width and present outside its boundary; and
  (iii) performing proximity effect correction operations, when correcting pattern data in each of said first to fourth cells for proximity effects, such that pattern data in each of said first to fourth cells are all used as a pattern to be corrected and a pattern in said frame zone present outside each of said first to fourth cells is used as a reference pattern; and
(d) writing said sample in accordance with said proximity-effect-corrected pattern.

11. A method according to claim 10 wherein when, in respect of a cell having no array structure, patterns in said cell are arranged two-dimensionally periodically, said cell is reconstructed as a set of a plurality of array element cells and thereafter proximity effect correction operations are carried out.

12. A method according to claim 10 further comprising the step of further dividing each array element cell in the cell having array structure into a plurality of sub-zones and correcting patterns in each sub-zone of said array element cell for proximity effects.

13. An apparatus for writing a pattern on a semiconductor sample based upon a resist pattern involving various design patterns by application of a charged-particle beam or light, said pattern being for use in manufacture of a semiconductor integrated circuit device having circuit portions corresponding to said pattern, said apparatus comprising:
(a) means for obtaining pattern data representing design patterns included in a pattern;

(b) means for developing said pattern data such that said design patterns are arranged in cells having a hierarchical relationship and corresponding to exposure patterns on the sample to be exposed to a charged-particle beam or light;

(c) means for correcting said pattern data for proximity effects by optimizing an amount of exposure to each of the exposure patterns when exposing resins coated on the sample to the charged-particle beam or to light, said correction means comprising:

(i) means for providing a first frame zone having a predetermined width inside a boundary of each cell;

(ii) means for providing a second frame zone having a predetermined width inside said first frame zone;

(iii) means for performing proximity effect correction operations to obtain a proximity-effect-corrected pattern such that a pattern in said second frame zone and a pattern inside said second frame zone are used as a pattern to be corrected and a pattern in said first frame zone is used as a reference pattern when correcting pattern data in said each cell for proximity effects and a pattern in said first frame zone in said each cell is added to the pattern to be corrected and a pattern in said second frame zone in said each cell is used as a reference pattern when correcting pattern data in a cell directly overlying said each cell for proximity effect; and (iv) means for determining an amount of exposure of each pattern to the charged particle beam or to the light in accordance with a result of the proximity effect correcting operations; and (d) means for writing said sample in accordance with said proximity-effect-corrected pattern and in accordance with said determined amount of exposure.

14. An apparatus according to claim 13 wherein in respect of a plurality of identical cells, proximity effect correction operations are carried out for one of said identical cells, and the results of the proximity effect correction operations are applied to other identical cells.

15. An apparatus according to claim 13, further comprising means for providing with a frame zone present outside its boundary and having a predetermined width, and proximity effect correction operations are performed, when correcting pattern data in said enclosed element cell for proximity effects, such that pattern data in said enclosed element cell are all used as a pattern to be corrected and pattern data in said frame zone outside said enclosed element cell is used as a reference pattern.

16. An apparatus according to claim 15 wherein the predetermined width of said frame zone is longer than a typical length affected by proximity effects which is equivalent to scattering length of back scattered electrons.

17. An apparatus according to claim 15 wherein when, in respect of a cell having no array structure, patterns in said cell are arranged two-dimensionally periodically, said cell is reconstructed as a set of a plurality of array element cells and thereafter proximity effect correction operations are carried out.

18. An apparatus according to claim 15 further comprising the step of further dividing each array element cell in the cell having array structure into a plurality of sub-zones and correcting patterns in each sub-zone of said array element cell for proximity effects.

19. An apparatus according to claim 13 wherein in respect of a cell having a predetermined size, proximity effect correction operations are carried out for all patterns excepting those in the first frame zone inside the boundary of said cell such that a zone inside said first frame zone is divided into a plurality of sub-zones, each sub-zone is provided with a third frame zone present outside its boundary and having a predetermined width, pattern data in said each sub-zone are all used as a pattern to be corrected and a pattern in said third frame zone is used as a reference pattern.

20. An apparatus according to claim 19 wherein the predetermined width of said third frame zone is longer than a typical length affected by proximity effects which is equivalent to scattering length of back scattered electrons.

21. An apparatus according to claim 13 wherein the predetermined width of each of said first and second frame zones is longer than a typical length affected by proximity effects which is equivalent to scattering length of back scattered electrons.

22. An apparatus for writing a pattern on a semiconductor sample based upon a resist pattern involving various design patterns by application of a charged-particle beam or light, said pattern being for use in manufacture of a semiconductor integrated circuit device having circuit portions corresponding to said pattern, said apparatus comprising:

(a) means for obtaining pattern data representing design patterns included in a pattern;

(b) means for developing said pattern data such that said design patterns are arranged in cells in an array having a basic unit in the form of an element cell;

(c) correction means for correcting said pattern data for proximity effects by optimizing an amount of exposure to each of the exposure patterns when exposing resins coated on the sample to the charged-particle beam or to light, said correction means comprising:

(i) means for dividing an element cell into nine rectangular zones in 3×3 matrix, and defining a second cell by putting together four different rectangular zones which are contiguous to each other and at corners of four different element cells contiguous to each other, defining third and fourth cells by putting together two different rectangular zones which are contiguous to each other and at sides of different element cells, and defining a first cell with a central rectangular zone of said element cell;

(ii) means for providing each of said first to fourth cells with a frame zone having a predetermined width and present outside its boundary;

(iii) means for performing proximity effect correction operations are carried out, when correcting pattern data in each of said first to fourth cells for proximity effects, such that pattern data in each of said first to fourth cells are all used as a pattern to be corrected and a pattern in said frame zone present outside each of said first to fourth cells is used as a reference pattern, and (iv) means for determining the amount of exposure of each pattern to the charged particle beam or to light in accordance with a result of the proximity effect correction operations; and (d) means for writing said sample in accordance with said proximity-effect-corrected pattern and in accordance with said determined amount of exposure.

23. An apparatus according to claim 22 wherein when, in respect of a cell having no array structure, patterns in said cell are arranged two-dimensionally periodically, said cell is reconstructed as a set of a plurality of array element cells and thereafter proximity effect correction operations are carried out.

24. An apparatus according to claim 22 further comprising the step of further dividing each array element cell in the cell having array structure into a plurality of sub-zones and correcting patterns in each sub-zone of said array element cell for proximity effects.

* * * * *